(12) United States Patent
Lee et al.

(10) Patent No.: US 12,557,471 B2
(45) Date of Patent: Feb. 17, 2026

(54) DISPLAY DEVICE INCLUDING PROTECTIVE LAYER INCLUDING PORTIONS RESPECTIVELY HAVING DIFFERENT THICKNESSES AND MANUFACTURING METHOD THEREOF

(71) Applicant: Samsung Display Co., Ltd., Yongin-si (KR)

(72) Inventors: Jinyong Lee, Seoul (KR); Doohwan Kim, Yongin-si (KR); Jongjin Park, Cheonan-si (KR); Sumin Jung, Seongnam-si (KR); Yoonhyeung Cho, Hwaseong-si (KR); Youngcheol Joo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 591 days.

(21) Appl. No.: 17/890,724

(22) Filed: Aug. 18, 2022

(65) Prior Publication Data
US 2023/0141999 A1     May 11, 2023

(30) Foreign Application Priority Data
Nov. 11, 2021    (KR) .......................... 10-2021-0154534

(51) Int. Cl.
*H10K 50/844* (2023.01)
*H10K 59/12* (2023.01)
(Continued)

(52) U.S. Cl.
CPC ......... *H10K 50/844* (2023.02); *H10K 59/122* (2023.02); *H10K 71/00* (2023.02); *H10K 59/1201* (2023.02)

(58) Field of Classification Search
CPC .. H10K 50/844; H10K 59/1315; H10K 71/00; H10K 59/1201; H10K 59/1213;
(Continued)

(56) References Cited

U.S. PATENT DOCUMENTS 9,792,867 B2 * 10/2017 Ohishi .................. G02F 1/1345
10,361,223 B2 * 7/2019 Kim ...................... H10D 89/911
(Continued)

FOREIGN PATENT DOCUMENTS

| JP | H11345803 A | 12/1999 |
| KR | 100476136 B1 | 3/2005 |

(Continued)

*Primary Examiner* — Caleb E Henry
(74) *Attorney, Agent, or Firm* — CANTOR COLBURN LLP

(57) ABSTRACT

A display device includes a display panel in which a display region and a pad region are defined. The display panel includes a base substrate, pixels disposed on the base substrate and disposed in the display region, a pad disposed on the base substrate, disposed in the pad region, and including a first surface and second surfaces connected to the first surface, and a protective layer which covers the pad and in which an opening exposing a first upper surface portion of the first surface of the pad is defined. A first thickness of a first portion of the protective layer covering a second upper surface portion of the first surface of the pad adjacent to the first upper surface portion of the first surface of the pad may be greater than a second thickness of a second portion of the protective layer covering second surfaces of the pad.

9 Claims, 18 Drawing Sheets

(51) Int. Cl.
H10K 59/122 (2023.01)
H10K 71/00 (2023.01)

(58) Field of Classification Search
CPC .. H10K 59/131; H10K 59/121; H10K 59/122; H10K 59/38; H10K 59/877; H10K 50/8445; H10D 86/441; H10D 86/451; H10D 86/60; H10H 29/142; H10H 20/01; H10H 20/857
See application file for complete search history.

(56) References Cited

U.S. PATENT DOCUMENTS

| | | | | |
|---|---|---|---|---|
| 10,503,297 | B2* | 12/2019 | Zeng | H04M 1/0266 |
| 10,575,403 | B2* | 2/2020 | Park | G02F 1/1333 |
| 10,872,944 | B2 | 12/2020 | Kim et al. | |
| 11,056,672 | B2* | 7/2021 | Huang | H10K 59/8793 |
| 11,151,933 | B2* | 10/2021 | Kim | G06F 3/0446 |
| 11,594,692 | B2* | 2/2023 | Choi | H10K 50/844 |
| 2007/0291042 | A1* | 12/2007 | Kwak | G09G 3/3688 345/535 |
| 2007/0296659 | A1* | 12/2007 | Kwak | G02F 1/13452 349/56 |
| 2008/0099450 | A1 | 5/2008 | Lewington et al. | |
| 2013/0001564 | A1* | 1/2013 | Choi | H10D 30/6729 257/40 |
| 2013/0228867 | A1* | 9/2013 | Suematsu | H01L 23/60 257/355 |
| 2014/0117998 | A1* | 5/2014 | Hwang | G09G 3/006 324/511 |
| 2014/0217373 | A1* | 8/2014 | Youn | H10K 50/805 438/23 |
| 2014/0217382 | A1* | 8/2014 | Kwon | H10K 50/8426 257/40 |
| 2014/0353670 | A1* | 12/2014 | Youn | H10D 86/60 438/586 |
| 2014/0376135 | A1* | 12/2014 | Huo | H10D 89/711 361/56 |
| 2015/0036300 | A1* | 2/2015 | Park | H05K 1/147 156/212 |
| 2015/0103500 | A1* | 4/2015 | Bae | H05K 1/111 228/102 |
| 2015/0270287 | A1* | 9/2015 | Kim | H10D 86/441 257/40 |
| 2015/0380679 | A1* | 12/2015 | Fujiyoshi | H10K 77/111 438/26 |
| 2016/0044751 | A1* | 2/2016 | Ikeda | H05B 33/02 362/227 |
| 2016/0172428 | A1* | 6/2016 | Song | H10K 59/131 257/40 |
| 2016/0174304 | A1* | 6/2016 | Kim | H10K 59/8792 |
| 2017/0069616 | A1* | 3/2017 | Cai | H10D 84/135 |
| 2017/0179112 | A1* | 6/2017 | Narita | H01L 23/5221 |
| 2018/0076415 | A1* | 3/2018 | Chung | G09G 3/3266 |
| 2018/0090702 | A1* | 3/2018 | Um | H10K 50/844 |
| 2018/0301520 | A1* | 10/2018 | Jin | H10K 59/1315 |
| 2019/0179591 | A1* | 6/2019 | Kuo | H10K 59/18 |
| 2019/0229446 | A1* | 7/2019 | Kim | H05K 1/111 |
| 2019/0281699 | A1* | 9/2019 | Bae | H05K 1/111 |
| 2019/0346953 | A1* | 11/2019 | Peng | G09G 3/20 |
| 2019/0393443 | A1* | 12/2019 | Chen | H10K 59/1315 |
| 2020/0168684 | A1* | 5/2020 | Kim | H10K 59/123 |
| 2020/0312236 | A1* | 10/2020 | Ma | G09G 3/3225 |
| 2021/0134910 | A1* | 5/2021 | Yang | H10D 86/60 |
| 2021/0273198 | A1* | 9/2021 | Cheng | H10K 59/40 |
| 2021/0286471 | A1* | 9/2021 | Chen | G06F 3/0443 |
| 2021/0296404 | A1* | 9/2021 | You | H10K 59/8792 |
| 2021/0313411 | A1* | 10/2021 | Jung | H10K 59/131 |
| 2021/0343811 | A1 | 11/2021 | Kim et al. | |
| 2022/0045301 | A1* | 2/2022 | Jang | H10K 59/124 |

FOREIGN PATENT DOCUMENTS

| | | |
|---|---|---|
| KR | 100822599 B1 | 4/2008 |
| KR | 1020080039197 A | 5/2008 |
| KR | 100920480 B1 | 10/2009 |
| KR | 101133094 B1 | 4/2012 |
| KR | 101657762 B1 | 9/2016 |
| KR | 1020200062434 A | 6/2020 |
| KR | 102165742 B1 | 10/2020 |
| KR | 1020210125736 A | 10/2021 |
| WO | 2004051702 A2 | 6/2004 |

\* cited by examiner

DISPLAY DEVICE INCLUDING PROTECTIVE LAYER INCLUDING PORTIONS RESPECTIVELY HAVING DIFFERENT THICKNESSES AND MANUFACTURING METHOD THEREOF

This application claims priority to Korean Patent Application No. 10-2021-0154534, filed on Nov. 11, 2021, and all the benefits accruing therefrom under 35 U.S.C. § 119, the content of which in its entirety is herein incorporated by reference.

BACKGROUND

1. Field

Embodiments of the invention herein relate to a display device with improved storage reliability and a manufacturing method thereof.

2. Description of the Related Art

Generally, a display device includes a display panel and a circuit board. The display panel includes pads and may be connected to the circuit board through the pads. The circuit board may be connected to the pad of the display panel by an anisotropic conductive film. Alternatively, electrodes of the circuit board and the pads of the display panel may be electrically connected through ultrasonic bonding without using an anisotropic conductive film.

SUMMARY

Embodiments of the invention provide a display device with improved storage reliability.

Embodiments of the invention also provide a display device manufacturing method which has a simplified manufacturing process, and with which a display device with improved storage reliability is provided.

An embodiment of the invention provides a display device which includes a display panel in which a display region and a pad region are defined. The display panel includes a base substrate, pixels disposed on the base substrate and disposed in the display region, a pad disposed on the base substrate, disposed in the pad region, and including a first surface and a plurality of second surfaces connected to the first surface, a protective layer which covers the pad and in which an opening that exposes a first upper surface portion of the first surface is defined and an encapsulation layer which covers the pixels. A first thickness of a first portion of the protective layer that covers a second upper surface portion of the first surface of the pad adjacent to the first upper surface portion of the first surface of the pad is greater than a second thickness of a second portion of the protective layer that covers the plurality of second surfaces of the pad, the first thickness is measured in a direction parallel to a direction perpendicular to the first surface, and the second thickness is measured in a direction parallel to a direction perpendicular to a second surface, contacting the second portion, among the plurality of second surfaces.

In an embodiment, the first thickness of the first portion of the protective layer may be about twice or more the second thickness of the second portion of the protective layer.

In an embodiment, the second thickness of the second portion of the protective layer may be about 2000 angstroms or more.

In an embodiment, the encapsulation layer may include an inorganic encapsulation layer and an organic encapsulation layer.

In an embodiment, in a plan view, the inorganic encapsulation layer and the organic encapsulation layer may be disposed in the entirety of the display region.

In an embodiment, in a plan view, the inorganic encapsulation layer and the organic encapsulation layer may not overlap the pad region.

In an embodiment, an edge region spaced apart from the display region with the pad region disposed therebetween may be further defined in the display panel, and the inorganic encapsulation layer may be disposed in the display region and the edge region.

In an embodiment, the protective layer may include an inorganic material.

In an embodiment, the display device may further include a light control layer which is disposed on the display panel, and includes an optical pattern that converts a color of source light provided from the display panel or scatters the source light.

In an embodiment of the invention, a manufacturing method of a display device includes forming, on a base substrate, a pixel circuit and a plurality of pads arranged in a first direction, forming a protective layer which covers a portion of each of the plurality of pads and the pixel circuit, forming, on the protective layer, an element layer including a light-emitting element electrically connected to the pixel circuit, forming an encapsulation layer including a plurality of inorganic encapsulation layers that cover both the element layer and the plurality of pads, and an organic encapsulation layer disposed between the plurality of inorganic encapsulation layers, and etching a portion of the plurality of inorganic encapsulation layers overlapping the plurality of pads, using atmospheric plasma.

In an embodiment, the etching using atmospheric plasma may include preparing a plasma generator which generates the atmospheric plasma, determining a frequency of an alternating current ("AC") voltage to be provided to the plasma generator, and etching the portion of the plurality of inorganic encapsulation layers overlapping the plurality of pads by applying the AC voltage of a determined frequency to the plasma generator.

In an embodiment, the determining the frequency of the AC voltage may include measuring, when all of the plurality of inorganic encapsulation layers contacting a portion of a first surface of each of the plurality of pads are removed, a ratio of a second thickness of a second portion of the protective layer that covers a second surface of each of the plurality of pads to a first thickness of a first portion of the protective layer that covers a portion of the first surface of each of the plurality of pads, according to the frequency, and determining the frequency based on the ratio.

In an embodiment, the determining the frequency of the AC voltage may include measuring, when all of the plurality of inorganic encapsulation layers contacting a portion of a first surface of each of the plurality of pads are removed, a thickness of the protective layer that covers a second surface connected to the first surface of each of the plurality of pads, according to the frequency, and determining the frequency that satisfies a condition in which the thickness is greater than or equal to a predetermined thickness as the frequency of the AC voltage.

In an embodiment, the predetermined thickness may be about 2000 angstroms.

In an embodiment, the etching the portion of the plurality of inorganic encapsulation layers may include etching the portion of the plurality of inorganic encapsulation layers by performing atmospheric plasma scanning on the plurality of pads in the first direction using the plasma generator.

In an embodiment, the etching the portion of the plurality of inorganic encapsulation layers may include aligning the plasma generator such that the plasma generator overlaps the plurality of pads, and etching the portion of the plurality of inorganic encapsulation layers by supplying the atmospheric plasma to the plurality of pads.

In an embodiment, the plasma generator may include a plurality of plasma generating units arranged in the first direction, and the plurality of plasma generating units each include a grounded tube and an electrode which is disposed in the grounded tube and to which the AC voltage is applied.

In an embodiment, the plasma generator may include an electrode that extends in the first direction and receives the AC voltage.

In an embodiment, the plasma generator may include a plurality of pin electrodes arranged in the first direction.

In an embodiment, the determined frequency may be about 18 kilohertz (kHz) or more.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
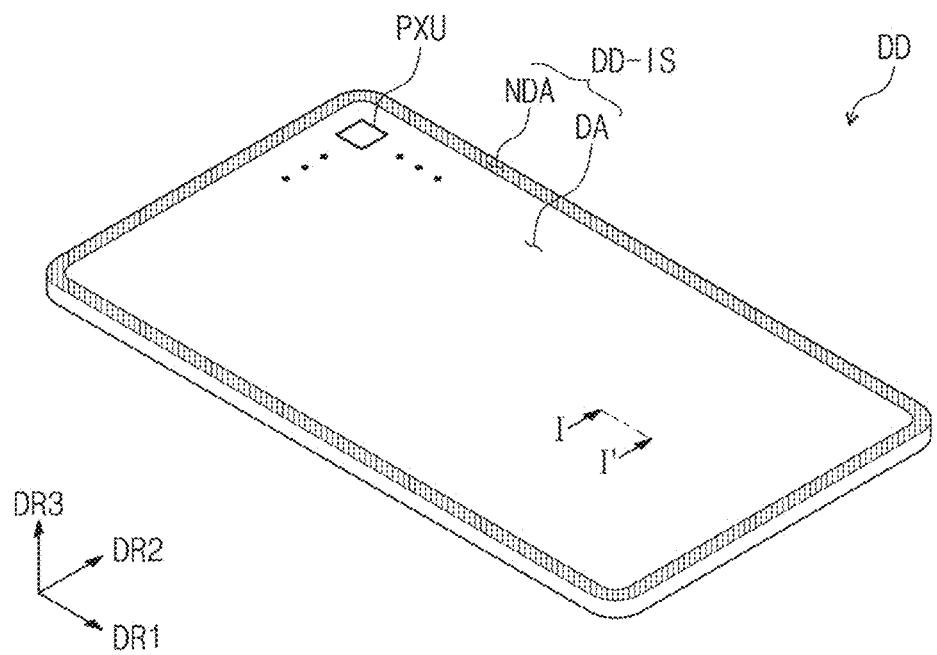
FIG. 1 is a perspective view of an embodiment of a display device according to the invention.

It will be understood that when an element (or a region, a layer, a portion, etc.) is referred to as being "on", "connected to" or "coupled to" another element, it can be directly disposed on, connected or coupled to the other element or intervening elements may be present therebetween.

Like reference numerals or symbols refer to like elements throughout. In addition, in the drawings, the thicknesses, the ratios, and the dimensions of elements are exaggerated for effective explanation of technical contents. The term "and/or" includes all combinations of one or more of the associated elements.

It will be understood that, although the terms first, second, etc., may be used herein to describe various elements, the elements should not be limited by these terms. These terms are exclusively used to distinguish one element from another element. A first element could be termed as a second element, and similarly, the second element could be termed as the first element, for example. The singular forms are intended to include the plural forms as well, unless the context clearly indicates otherwise.

In addition, the terms "below", "beneath", "on" and "above" are used for explaining the relation of elements illustrated in the drawings. The terms are relative concept and are explained based on the direction illustrated in the drawing.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. Furthermore, it will be further understood that terms, such as those defined in commonly used dictionaries, should be interpreted as having a meaning that is consistent with their meaning in the context of the related art and will not be interpreted in an idealized or overly formal sense unless expressly so defined herein.

Hereinafter, embodiments of the invention will be explained with reference to the accompanying drawings.

Figure 2:
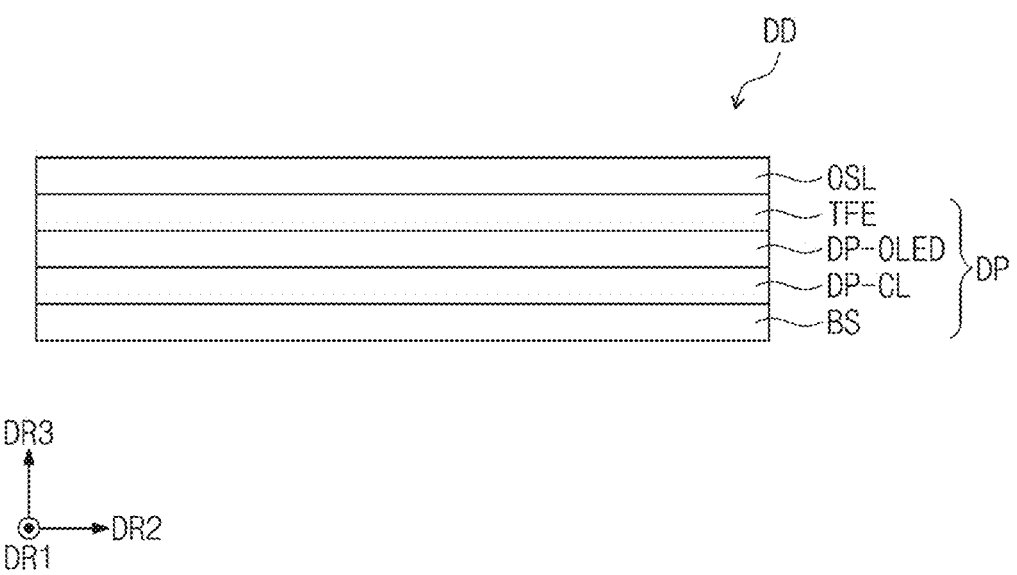
FIG. 2 is a cross-sectional view of an embodiment of a display device according to the invention.

FIG. 1 is a perspective view of an embodiment of a display device DD according to the invention. FIG. 2 is a cross-sectional view of an embodiment of a display device DD according to the invention.

Referring to FIGS. 1 and 2, the display device DD may display an image through a display surface DD-IS. The display surface DD-IS is in parallel with a plane defined by a first direction DR1 and a second direction DR2 intersecting the first direction DR1. An upper surface of a member disposed on the uppermost side of the display device DD may be defined as the display surface DD-IS.

A normal direction of the display surface DD-IS, that is the thickness direction of the display device DD, is indicated by a third direction DR3. A front surface (or upper surface) and a rear surface (or lower surface) of each layer or unit to be described below may be distinguished based on the third direction DR3.

The display device DD may include a display region DA and a non-display region NDA. Unit pixels PXU are disposed in the display region DA, and are not disposed in the non-display region NDA. The non-display region NDA is defined along an edge of the display surface DD-IS. The non-display region NDA may surround the display region DA. In an embodiment of the invention, the non-display region NDA may be omitted or may be disposed on one side of the display region DA. FIG. 1 illustrates a planar display device DD, but the display device DD may have a curved shape.

The display device DD in an embodiment of the invention includes a display panel DP and a light control layer OSL. A protective film, a window, or a functional coating layer that provides a front surface of the display device DD may be further disposed on the light control layer OSL.

The display panel DP may include a base substrate BS, a circuit element layer DP-CL disposed on the base substrate BS, an element layer DP-OLED, and an encapsulation layer TFE. The display panel DP may be a component that substantially generates an image. The display panel DP may be a light-emitting display panel, and for example, the display panel DP may be an organic light-emitting display panel, an inorganic light-emitting display panel, an organic-inorganic light-emitting display panel, a quantum dot display panel, a micro light-emitting diode ("LED") display panel, or a nano LED display panel.

The base substrate BS may be a member that provides a base surface on which the circuit element layer DP-CL is disposed. The base substrate BS may be a glass substrate, a metal substrate, a polymer substrate, or the like. However, the invention is not limited thereto, and the base substrate BS may be an inorganic layer, an organic layer or a composite material layer.

The circuit element layer DP-CL includes driving circuits or signal lines of the unit pixels PXU. The element layer DP-OLED includes a light-emitting element disposed in each unit pixel PXU.

The encapsulation layer TFE includes at least one inorganic layer and at least one organic layer that seal the light-emitting element.

The light control layer OSL may covert the optical properties of source light generated from the light-emitting element. The light control layer OSL may include a light conversion pattern that convert the source light into light of a different color and a scattering pattern that scatters the source light.

Figure 3:
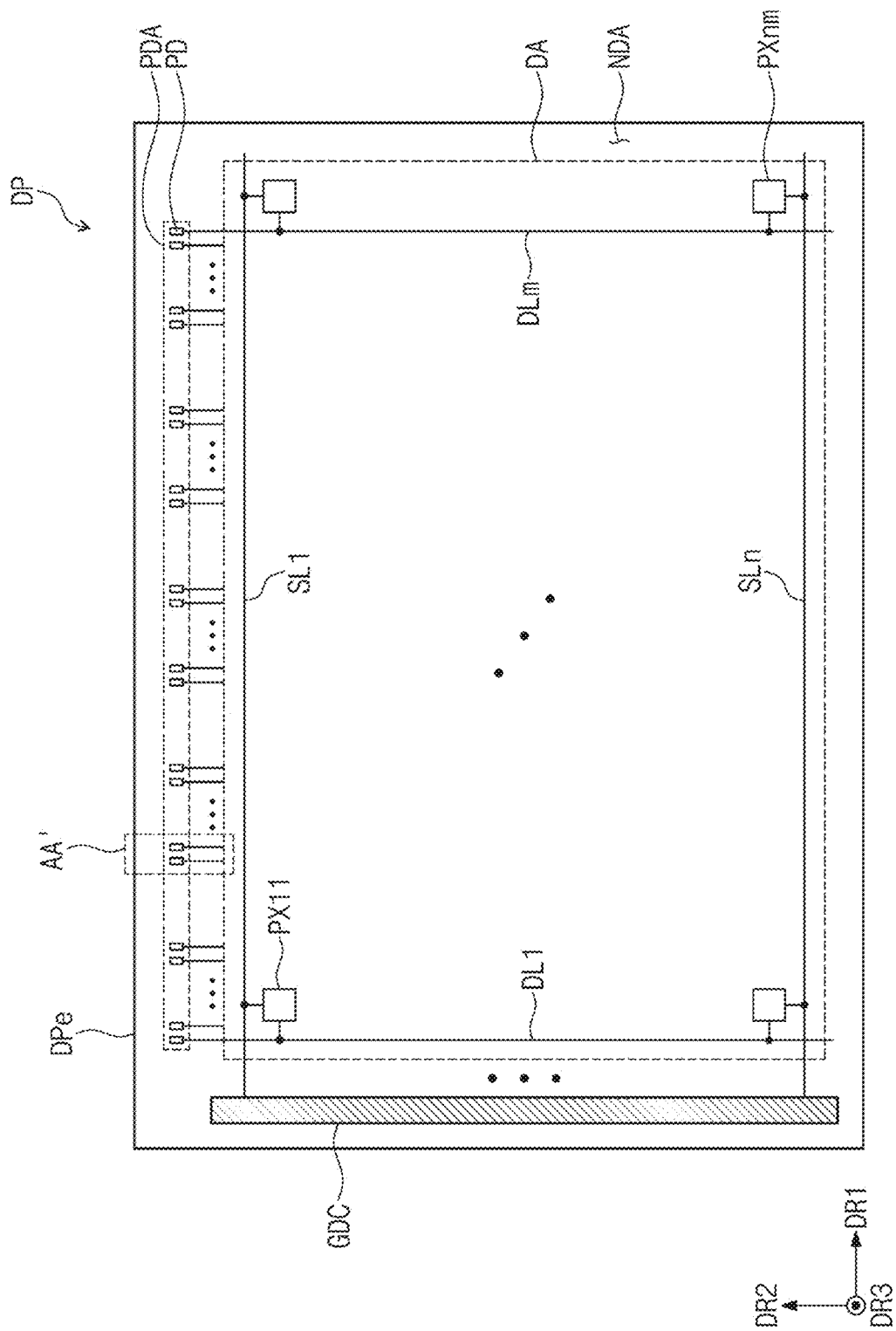
FIG. 3 is a plan view of an embodiment of a display panel according to the invention.

FIG. 3 is a plan view of an embodiment of the display panel DP according to the invention.

Referring to FIG. 3, a planar arrangement relationship of signal lines SL1-SLn and DL1-DLm and pixels PX11 to PXnm included in the display panel DP are illustrated. Here, n and m are natural numbers. The signal lines SL1-SLn and DL1-DLm may include a plurality of scan lines SL1-SLn and a plurality of data lines DL1-DLm.

The pixels PX11 to PXnm are respectively connected to corresponding scan lines among the plurality of scan lines SL1-SLn and corresponding data lines among the plurality of data lines DL1-DLm. The pixels PX11 to PXnm may each include a pixel driving circuit and a light-emitting element. A larger variety of signal lines may be provided on the display panel DP according to the configuration of the pixel driving circuit of each of the pixels PX11 to PXnm.

The display region DA and the non-display region NDA of the display device DD illustrated in FIG. 1 may also be similarly defined in the display panel DP. The pixels PX11 to PXnm are disposed in the display region DA and a gate driving circuit GDC is disposed in the non-display region NDA. However, this is one of embodiments, and at least a portion or the entirety of the gate driving circuit GDC may be disposed in the display region DA. A plurality of pixels among the pixels PX11 to PXnm is formed or provided into a single group and are repetitively disposed. The group corresponds to the unit pixels PXU described in FIG. 1.

Pads PD may be disposed in the non-display region NDA. In an embodiment, a pad region PDA adjacent to an edge DPe of the display panel DP may be defined in the non-display region NDA, and the pads PD may be disposed in the pad region PDA, for example. The pad region PDA may be defined between the display region DA and the edge DPe of the display panel DP. A circuit board, e.g., a flexible circuit film, may be electrically connected to the pads PD. In an embodiment, the circuit board may be electrically connected to the pads PD by an anisotropic conductive film, for example. In addition, electrodes of the circuit board may be electrically connected to the pads PD through ultrasonic bonding without using of the anisotropic conductive film.

A driving chip may include driving elements, e.g., data driving circuits, for driving the pixels PX11 to PXnm of the display panel DP. The driving chip may be disposed (e.g., mounted) on the display panel DP, e.g., in the pad region PDA or on the circuit board.

Figure 4:
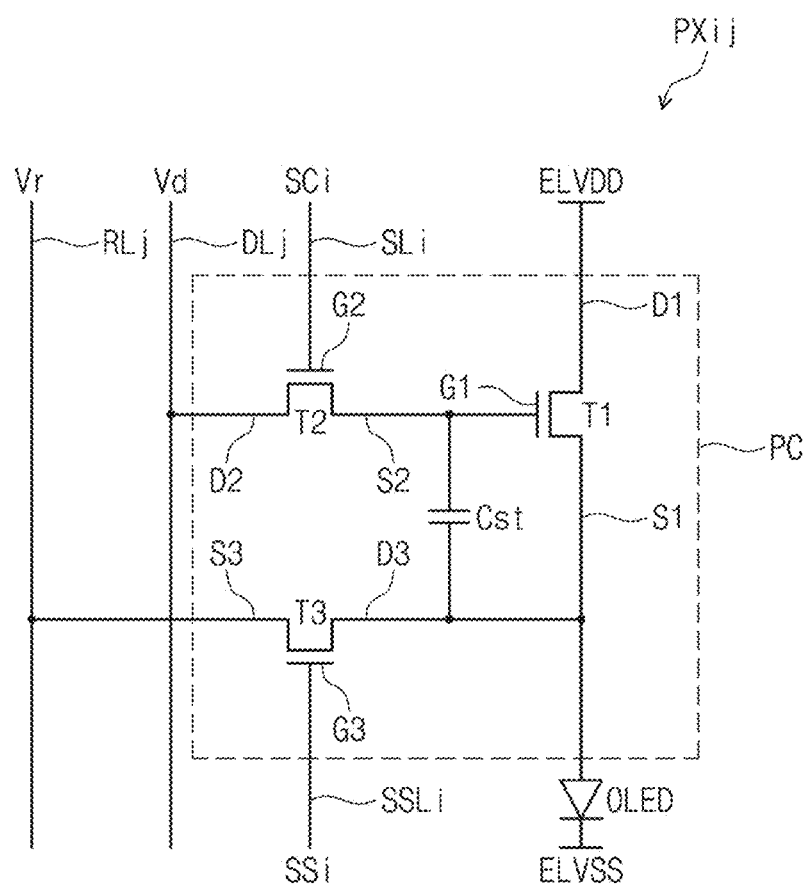
FIG. 4 is an equivalent circuit diagram of an embodiment of a pixel according to the invention.

FIG. 4 is an equivalent circuit diagram of an embodiment of a pixel PXij according to the invention. Here, i is a natural number equal to or less than n and j is a natural number equal to or less than m.

Referring to FIG. 4, the pixel PXij connected to an i-th scan line SLi, an i-th sensing line SSLi, a j-th data line DLj, and a j-th reference line RLj is illustrated. The pixel PXij includes a pixel circuit PC and a light-emitting element OLED connected to the pixel circuit PC. The pixel circuit PC may include a plurality of transistors TI to T3 and a capacitor Cst.

The plurality of transistors T1 to T3 may be formed or provided through a low temperature polycrystalline silicon ("LTPS") process or a low temperature polycrystalline oxide ("LTPO") process. Hereinafter, the plurality of transistors TI to T3 may be described as N-type transistors, but at least one transistor may be implemented as a P-type transistor.

In this embodiment, a pixel circuit PC including a first transistor TI (also referred to as a driving transistor), a second transistor T2 (also referred to as a switch transistor), a third transistor T3 (also referred to as a sensing transistor), and a capacitor Cst is illustrated. However, the pixel circuit PC is not limited thereto. The pixel circuit PC may further include an additional transistor or an additional capacitor.

The light-emitting element OLED may be an organic light-emitting element which includes an anode (first electrode) and a cathode (second electrode) or an inorganic light-emitting element. However, the invention is not limited thereto, and in another embodiment, the anode and the cathode of the light-emitting element OLED may be switched with each other according to a structure of the pixel circuit PC. The anode of the light-emitting element OLED may receive a first voltage ELVDD through the first transistor, and the cathode of the light-emitting element OLED may receive a second voltage ELVSS. The light-emitting element OLED may emit light upon receiving the first voltage ELVDD and the second voltage ELVSS.

The first transistor T1 may include a drain D1 which receives the first voltage ELVDD, a source S1 connected to the anode of the light-emitting element OLED, and a gate G1 connected to the capacitor Cst. However, the invention is not limited thereto, and in another embodiment, a source and a drain of a transistor of the pixel circuit PC may be switched with each other according to a structure of the pixel circuit PC. The first transistor T1 may control a driving current flowing into the light-emitting element OLED from the first voltage ELVDD in response to a voltage level stored in the capacitor Cst.

The second transistor T2 may include a drain D2 connected to the j-th data line DLj, a source S2 connected to the capacitor Cst, and a gate G2 which receives the i-th first scan signal SCi. The j-th data line DLj may receive a data voltage Vd. The second transistor T2 provides the data voltage Vd to the first transistor T1 in response to the j-th first scan signal SCi.

The third transistor T3 may include a source S3 connected to the j-th reference line RLj, a drain D3 connected to the anode of the light-emitting element OLED, and a gate G3 which receives an i-th second scan signal SSi. The j-th reference line RLj may receive a reference voltage Vr. The third transistor T3 may initialize the capacitor Cst, and the anode of the light-emitting element OLED.

The capacitor Cst may store a voltage corresponding to a difference between a voltage received from the second transistor T2 and the first voltage ELVDD. The capacitor Cst may be connected to the gate G1 of the first transistor T1 and the anode of the light-emitting element OLED.

Figure 5:
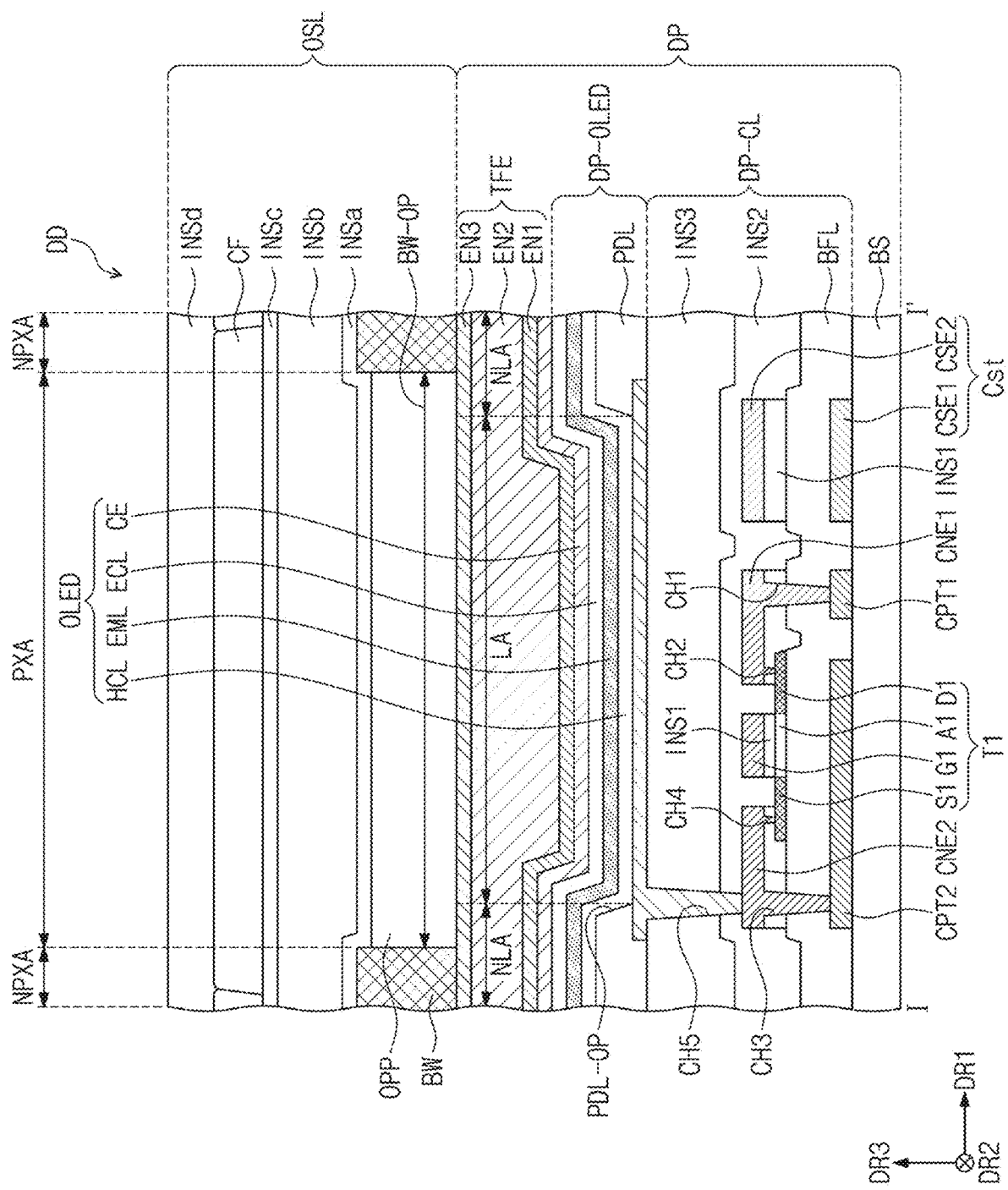
FIG. 5 is a cross-sectional view of an embodiment of a display device according to the invention.

FIG. 5 is a cross-sectional view of an embodiment of the display device DD along line I-I' of FIG. 1 according to the invention.

Referring to FIG. 5, the first transistor T1 and a cross section of one pixel region PXA corresponding thereto are illustrated.

A power source line CPT1, a light-shielding pattern CPT2, and a first electrode CSE1 of the capacitor Cst may be disposed on the base substrate BS. The power source line CPT1, the light-shielding pattern CPT2, and the first electrode CSE1 of the capacitor Cst may include a metal. A buffer layer BFL may be disposed on the base substrate BS, and cover the power source line CPT1, the light-shielding pattern CPT2, and the first electrode CSE1 of the capacitor Cst.

Semiconductor patterns D1, A1, and S1 overlapping the light-shielding pattern CPT2 may be disposed on the buffer layer BFL. The semiconductor patterns D1, A1, and S1 may include the source S1, a channel region A1 (also referred to as an active region), and the drain D1. The semiconductor patterns D1, A1, and S1 may have different electrical properties according to whether being doped or not and the doping concentration. The semiconductor patterns D1, A1, and S1 may include first regions D1 and S1 with a high conductivity and a second region A1 with a lower conductivity. The first regions D1 and S1 may be doped with an N-type dopant or a P-type dopant. A P-type transistor may include a doped region doped with the P-type dopant, and an N-type transistor may include a doped region doped with the N-type dopant. The second region A1 may be an undoped region or a region doped with a relatively low concentration compared to the first regions D1 and S1.

A first insulation layer INS1 may be disposed on one portion of the semiconductor patterns D1, A1, and S1 and the buffer layer BFL. The first insulation layer INS1 may be patterned into a predetermined shape and overlap the gate G1, first and second connection electrodes CNE1 and CNE2, and a second electrode CSE2 of the capacitor Cst to be described below. Specifically, the first insulation layer INS1 may include a plurality of separated insulation patterns, and the insulation patterns may be separated from each other to overlap the gate G1, the first and second connection electrodes CNE1 and CNE2, and the second electrode CSE2 of the capacitor, respectively. The buffer layer BFL and the first insulation layer INS1 may be inorganic layers.

The gate G1, and the first and second connection electrodes CNE1 and CNE2 and the second electrode CSE2 of the capacitor Cst may be disposed on the first insulation layer INS1.

The first connection electrode CNE1 may be connected to the power source line CPT1, which supplies a power source to be provided to the light-emitting element OLED, through a first contact hole CH1 defined in the first insulation layer INS1 and the buffer layer BFL. The first voltage ELVDD (refer to FIG. 4) may be supplied to the first transistor T1 through the power source line CPT1. The first connection electrode CNE1 may be connected to the drain D1 through a second contact hole CH2 defined in the first insulation layer INS1.

The second connection electrode CNE2 may be connected to the light-shielding pattern CPT2 through a third contact hole CH3 defined in the first insulation layer INS1 and the buffer layer BFL. The second connection electrode CNE2 may be connected to the source S1 through a fourth contact hole CH4 defined in the first insulation layer INS1.

The second insulation layer INK may be disposed on the gate G1, the first and second connection electrodes CNE1 and CNE2, and the second electrode CSE2. The second insulation layer INS2 may include an inorganic material. The second insulation layer INS2 may be disposed on the buffer layer BFL to cover the gate G1, the first and second connection electrodes CNE1 and CNE2, and the second electrode CSE2.

A third insulation layer INS3 may be disposed on the second insulation layer INS2. The third insulation layer INS3 may include an organic layer. The third insulation layer INS3 may provide a flat upper surface. Layers from the buffer layer BFL to the third insulation layer INS3 may be layers including the first transistor T1 and the capacitor Cst and may be defined as a circuit element layer DP-CL.

The element layer DP-OLED may be disposed on the circuit element layer DP-CL. The element layer DP-OLED may include a light-emitting element OLED and a pixel defining film PDL. In addition, although not illustrated, the element layer DP-OLED may further include a spacer disposed on the pixel defining film PDL. The light-emitting element OLED may include a first electrode AE (or anode), a hole control layer HCL, a light-emitting layer EML, an electron control layer ECL, and a second electrode CE (or cathode).

The first electrode AE may be disposed on the third insulation layer INS3, and the first electrode AE may be connected to the second connection electrode CNE2 through a fifth contact hole CH5 defined in the third insulation layer INS3 and the second insulation layer INS2. The first electrode AE is connected to the second connection electrode CNE2 such that the source S1 may be connected to the light-emitting element OLED through the second connection electrode CNE2.

The pixel defining film PDL may be disposed on portions of the third insulation layer INS3 and the first electrode AE. An opening PDL-OP of the pixel defining film PDL exposes at least one portion of the first electrode AE. The opening PDL-OP of the pixel defining film PDL may define a light-emitting region LA. A region in which the pixel defining film PDL is disposed may be defined as a non-light-emitting region NLA.

The hole control layer HCL may be disposed in common in the light-emitting region LA and the non-light-emitting region NLA. A common layer such as the hole control layer HCL may be disposed in the display region DA illustrated in FIG. 3 to overlap the plurality of pixels PX11 to PXnm. The hole control layer HCL may include a hole transport layer and a hole injection layer.

The light-emitting layer EML is disposed on the hole control layer HCL. The light-emitting layer EML may be commonly disposed in the light-emitting region LA and the non-light-emitting region NLA. The light-emitting layer EML may generate source light. In this embodiment, the source light may be blue light and may be described herebelow as first color light. However, the invention is not limited thereto, and in another embodiment, the source light may have various other colors.

The electron control layer ECL is disposed on the light-emitting layer EML. The electron control layer ECL may include an electron transport layer and an electron injection layer. The electron control layer ECL may be disposed in common in the light-emitting region LA and the non-light-emitting region NLA.

The second electrode CE may be disposed on the electron control layer ECL. The second electrode CE may be commonly disposed on the pixels PX11 to PXnm (refer to FIG. 3).

The encapsulation layer TFE may be disposed on the second electrode CE to cover the light-emitting element OLED. The encapsulation layer TFE may include a first inorganic encapsulation layer EN1 disposed on the second electrode CE, an organic encapsulation layer EN2 disposed on the first inorganic encapsulation layer EN1, and a second inorganic encapsulation layer EN3 disposed on the organic encapsulation layer EN2. The first and second inorganic encapsulation layers EN1 and EN3 may include an inorganic material, and the organic encapsulation layer EN2 may include an organic material. The first and second inorganic encapsulation layers EN1 and EN3 may protect the light-emitting element OLED against moisture and oxygen. The organic encapsulation layer EN2 may protect the light-emitting element OLED against foreign substances such as dust particles.

The light control layer OSL may be disposed on the encapsulation layer TFE. In this embodiment, the light control layer OSL may be illustrated to contact an uppermost inorganic layer of the encapsulation layer TFE, but an additional buffer layer may be further disposed between the uppermost inorganic layer of the encapsulation layer TFE and the light control layer OSL.

A partition wall BW (also referred to as a division pattern) is disposed on the encapsulation layer TFE. The partition wall BW overlaps the non-light-emitting region NLA. An opening BW-OP is defined in the partition wall BW. The opening BW-OP defines a pixel region PXA corresponding to the non-light-emitting region NLA.

An optical pattern OPP may be disposed on the inside of the opening BW-OP. The optical pattern OPP may contact the partition wall BW that defines the opening BW-OP thereof. The optical pattern OPP may be a light conversion pattern or a scattering pattern. In an embodiment, when the pixel region PXA is a green or red pixel region, the optical pattern OPP may be a light conversion pattern, for example. The light conversion pattern may absorb source light generated from the light-emitting element OLED and generate light having a different color, and the light having different color may be green light or red light. In an embodiment, when the pixel region PXA is a blue pixel region, the optical pattern OPP may be a scattering pattern, for example. The scattering pattern may scatter the source light generated from the light-emitting element OLED.

The first insulation layer INSa may cover the partition wall BW and the optical pattern OPP. The first insulation layer INSa may be an inorganic layer that seals the partition wall BW and the optical pattern OPP. In an embodiment of the invention, the first insulation layer INSa may be omitted.

A second insulation layer INSb may be disposed on the first insulation layer INSa. The second insulation layer INSb may have a lower refractive index than that of the first insulation layer INSa. In an embodiment, the refractive index of the second insulation layer INSb may be from about 1.1 to about 1.5, for example. The refractive index of the second insulation layer INSb may be adjusted by a proportion of hole inorganic particles and/or voids included in the second insulation layer INSb. The second insulation layer INSb may more vertically provide the source light and the converted light.

A third insulation layer INSc may be disposed on the second insulation layer INSb. The third insulation layer INSc may be an inorganic layer that seals a structure formed or provided therebelow. In an alternative embodiment, the third insulation layer INSc may be omitted.

A color filter CF corresponding to the pixel region PXA may be disposed on the third insulation layer INSc. The color filter CF may lower a reflectivity for external light. The color filter CF may overlap the pixel region PXA and may partially overlap a peripheral region NPXA adjacent to the pixel region PXA. The color filter CF may partially overlap another color filter adjacent thereto.

A fourth insulation layer INSd may be disposed on the color filter CF. The fourth insulation layer INSd may include an organic layer and provide a flat surface.

Figure 6:
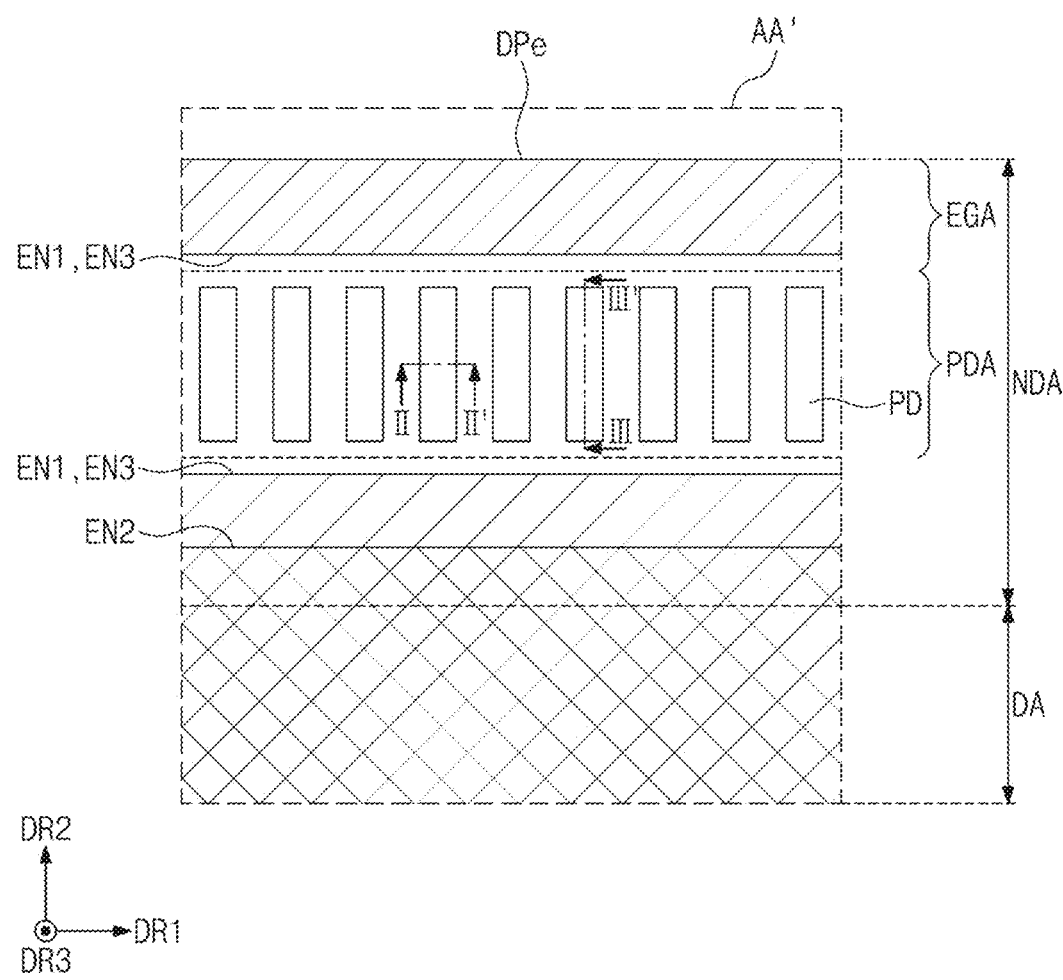
FIG. 6 is an enlarged plan view of an embodiment of one portion of a display device according to the invention.

FIG. 6 is an enlarged plan view illustrating an embodiment of one portion of the display panel according to the invention. FIG. 6 is an enlarged plan view of AA' of FIG. 3.

Referring to FIGS. 3 and 6, an edge region EGA spaced apart from the display region DA with the pad region PDA disposed therebetween may be further defined on the display panel DP.

The pads PD may be spaced in the first direction DR1 in the pad region PDA, the pad region PDA may be spaced apart in the second direction DR2 from the display region DA, and the edge region EGA may be adjacent to the pad region PDA in the second direction DR2.

In a plan view, all of the first inorganic encapsulation layer EN1, the organic encapsulation layer EN2, and the second inorganic encapsulation layer EN3 may be disposed in the display region DA. An edge of the organic encapsulation layer EN2 may be disposed in the non-display region NDA between the pad region PDA and the display region DA. In a plan view, all of the first inorganic encapsulation layer EN1, the organic encapsulation layer EN2, and the second inorganic encapsulation layer EN3 may not overlap the pad region PDA. In a plan view, the first inorganic encapsulation layer EN1 and the second inorganic encapsulation layer EN3 may be disposed in the edge region EGA.

In an embodiment of the invention, the first inorganic encapsulation layer EN1 and the second inorganic encapsulation layer EN3 may be deposited without a mask and one portion of each of the first inorganic encapsulation layer EN1 and the second inorganic encapsulation layer EN3 overlapping the pad region PDA may be removed. Since a mask is not used, costs for a mask material and costs for supporting the mask may be reduced. In addition, after the first inorganic encapsulation layer EN1 and the second inorganic encapsulation layer EN3 are formed or provided, portions overlapping the pad region PDA are removed and thus the first inorganic encapsulation layer EN1 and the second inorganic encapsulation layer EN3 may partially remain in the edge region EGA.

Figure 7A:
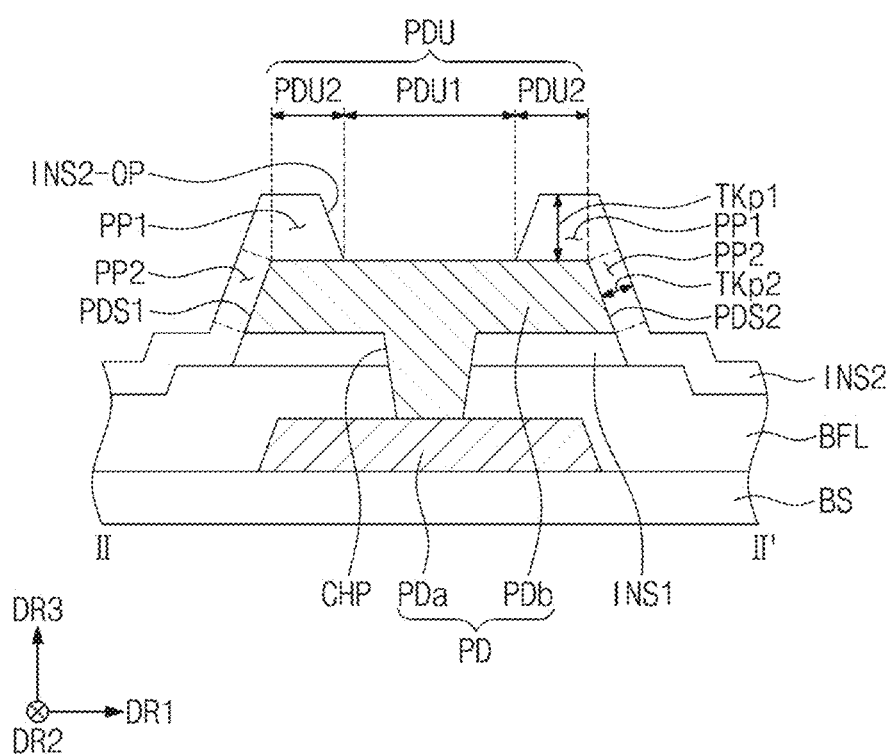
FIG. 7A is a cross-sectional view of an embodiment of a display panel according to the invention.
Figure 7B:
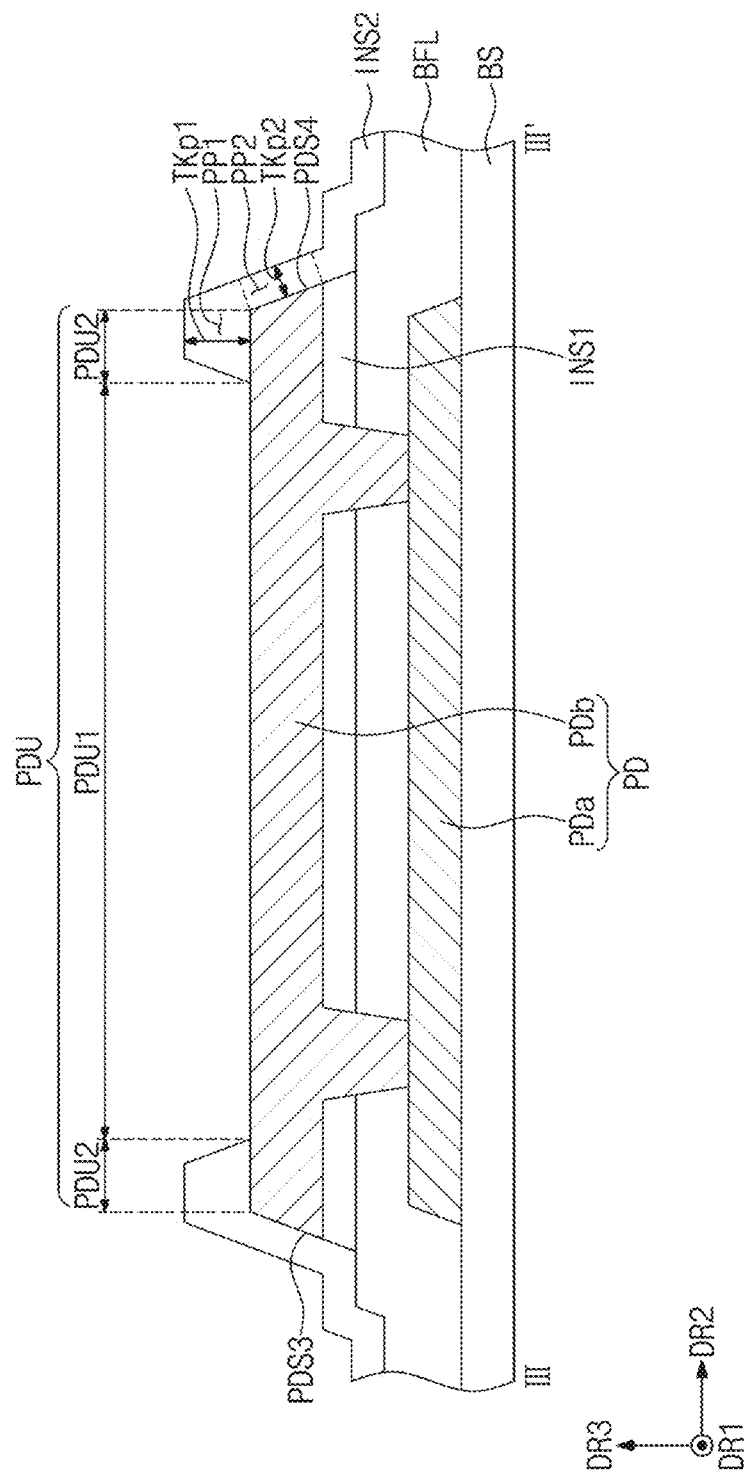
FIG. 7B is a cross-sectional view of an embodiment of a display panel according to the invention.

FIG. 7A is a cross-sectional view of an embodiment of the display panel according to the invention. FIG. 7B is a cross-sectional view of an embodiment of the display panel according to the invention. FIG. 7A is a cross-sectional view taken along line II-IP of FIG. 6. FIG. 7B is a cross-sectional view taken along line of FIG. 6.

Referring to FIGS. 7A and 7B, the pad PD may include a first pad pattern PDa and a second pad pattern PDb. The first pad pattern PDa may be disposed on the base substrate BS. The second pad pattern PDb may be disposed on the first insulation layer INS1. The second pad pattern PDb may be connected to the first pad pattern PDa through the contact hole CHP defined in the first insulation layer INS1 and the buffer layer BFL. FIGS. 7A and 7B illustrate that the pad PD includes a first pad pattern PDa and a second pad pattern PDb, but an embodiment of the invention is not particularly limited thereto. In an embodiment, the pad PD may only include the second pad pattern PDb, for example.

The first pad pattern PDa, the power source line CPT1, the light-shielding pattern CPT2, and the first electrode CSE1 of the capacitor Cst illustrated in FIG. 5 may include the same material, and may be formed or provided through the same process. The second pad pattern PDb, the gate G1, the first and second connection electrodes CNE1 and CNE2, and the second electrode CSE2 of the capacitor Cst may include the same material, and may be formed or provided through the same process.

In an embodiment, the first pad pattern PDa may be a double layer in which titanium (Ti) and copper (Cu) are sequentially stacked, and the second pad pattern PDb may be a triple layer in which titanium (Ti), copper (Cu), and indium tin oxide ("ITO") are sequentially stacked. However, this is merely one of embodiments, and a metal material and a layer structure constituting each of the first pad pattern PDa and the second pad pattern PDb are not limited thereto.

The pad PD may include a first surface PDU and second surfaces PDS1, PDS2, PDS3, and PDS4. In an embodiment, the first surface PDU and the second surfaces PDS1, PDS2, PDS3, and PDS4 may be included in the second pad pattern PDb, for example. The second surfaces PDS1, PDS2, PDS3, and PDS4 may be connected to the first surface PDU. The first surface PDU may be also referred to as an upper surface, and the second surfaces PDS1, PDS2, PDS3, and PDS4 may be also referred to as side surfaces.

The first surface PDU may be defined as a surface substantially parallel to a plane defined by the first direction DR1 and the second direction DR2. The second surfaces PDS1, PDS2, PDS3, and PDS4 may be surfaces inclined with respect to the plane defined by the first direction DR1 and the second direction DR2. In an embodiment, an angle between the plane defined by the first direction DR1 and the second direction DR2 and the second surfaces PDS1, PDS2, PDS3, and PDS4 may be greater than about 0 degrees and less than about 180 degrees, and for example, the angle may be about 90 degrees or more and less than about 180 degrees.

The second insulation layer INS2 may cover at least a portion of the pad PD and protect the pad PD. In an embodiment, the second insulation layer INS2 may protect the second surfaces PDS1, PDS2, PDS3, and PDS4 of the pad PD, for example. Hereinafter, the second insulation layer INS2 is also referred to as a protective layer.

An opening INS2-OP that exposes a first upper surface portion PDU1 of the first surface PDU of the pad PD may be defined in the protective layer INS2. A second upper surface portion PDU2 of the first surface PDU of the pad PD may be covered by the protective layer INS2. The second upper surface portion PDU2 may be one portion of the first surface PDU connected to the second surfaces PDS1, PDS2, PDS3, and PDS4.

The protective layer INS2 may include a first portion PP1 that covers the second upper surface portion PDU2 and a second portion PP2 that covers the second surfaces PDS1, PDS2, PDS3, and PDS4. A first thickness TKp1 of the first portion PP1 is greater than a second thickness TKp2 of the second portion PP2. In an embodiment, the first thickness TKp1 of the first portion PP1 may be about two or more times greater than the second thickness TKp2 of the second portion PP2, for example. The first thickness Tkp1 may be a thickness in a direction perpendicular to the first surface PDU, for example, a thickness in a direction parallel to the third direction (also referred to as a thickens direction) DR3. The second thickness TKp2 may be a thickness in a direction parallel to a direction perpendicular to the second surface PDS2 that contacts the second portion PP2 among the second surfaces PDS1, PDS2, PDS3, and PDS4.

Figure 8:
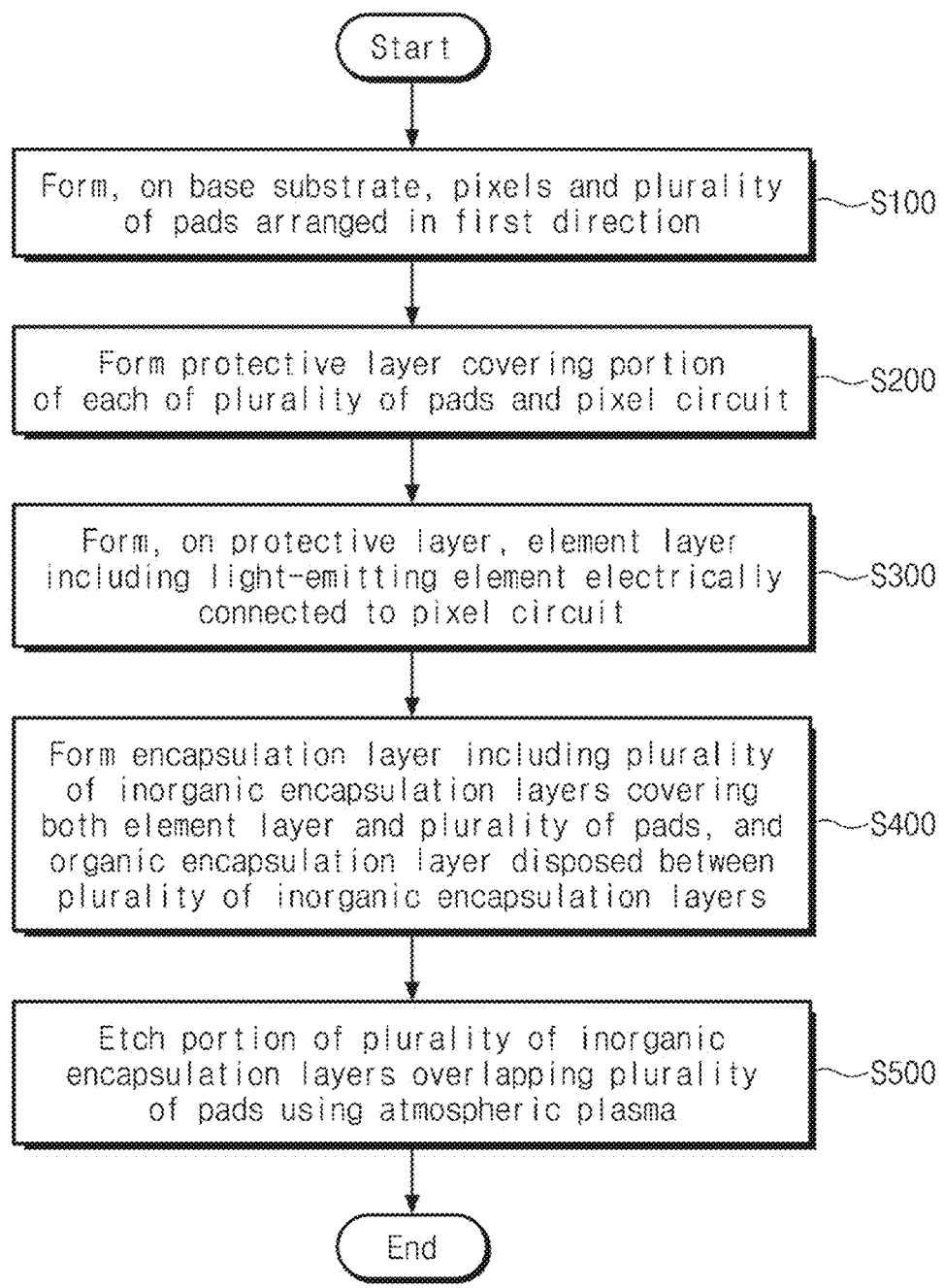
FIG. 8 is a flowchart illustrating an embodiment of a manufacturing method of a display device according to the invention.
Figure 9:
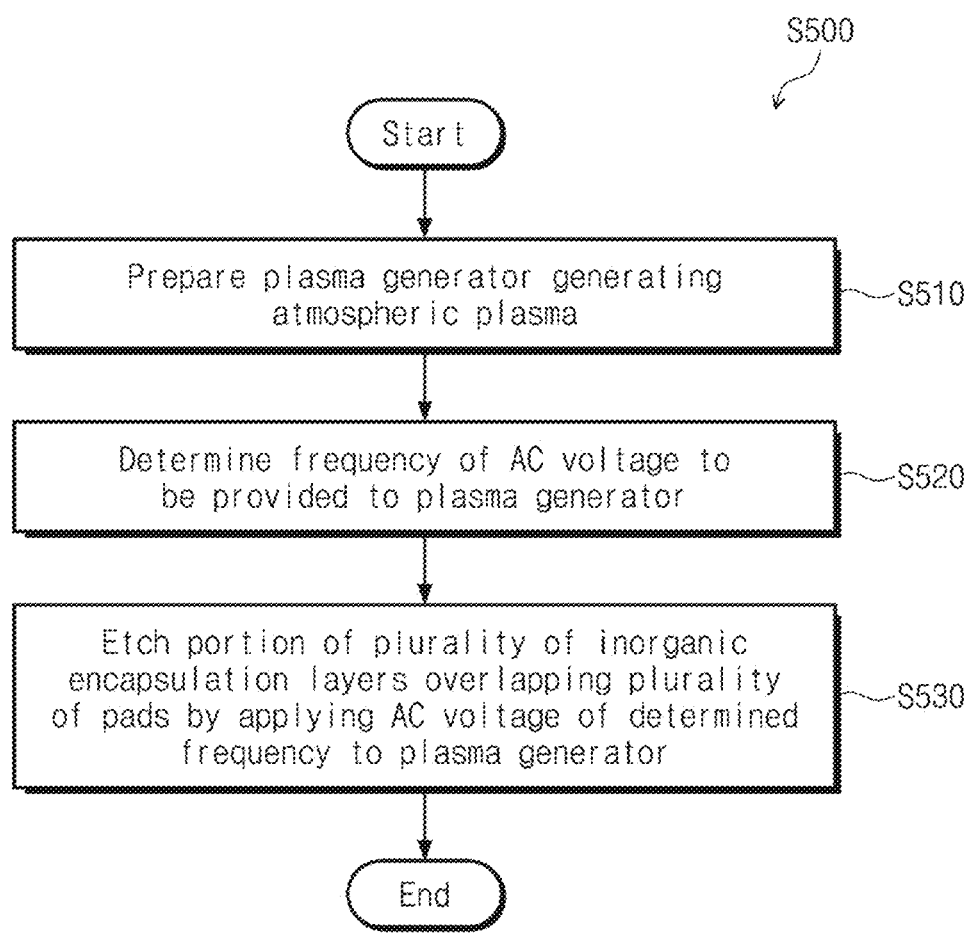
FIG. 9 is a flowchart illustrating an embodiment of a manufacturing method of a display device according to the invention.

FIG. 8 is a flowchart illustrating an embodiment of a manufacturing method of a display device according to the invention. FIG. 9 is a flowchart illustrating an embodiment of a manufacturing method of a display device according to the invention.

Referring to FIGS. 5, 6, 7A, 8, and 9, a pixel circuit PC (refer to FIG. 4) and a plurality of pads PD arranged in a first direction DR1 are formed or disposed on a base substrate BS (S100). A protective layer INS2 that covers one portion of each of the plurality of pads PD and the pixel circuit PC (refer to FIG. 4) is formed or provided (S200). An element layer DP-OLED that includes a light-emitting element OLED (refer to FIG. 4) electrically connected to the pixel circuit PC (refer to FIG. 4) is formed or disposed on the protective layer INS2 (S300).

An encapsulation layer TFE including a plurality of inorganic encapsulation layers EN1 and EN3 that cover both the element layer DP-OLED and the plurality of pads PD and an organic encapsulation layer EN2 disposed between the plurality of inorganic encapsulation layers EN1 and EN3 is formed or provided (S400).

The first inorganic encapsulation layer EN1 is formed or provided by depositing an inorganic material on the entirety of the display region DA and the non-display region NDA. Afterwards, the organic encapsulation layer EN2 is formed or disposed on the first inorganic encapsulation layer EN1. The organic encapsulation layer EN2 may be formed or provided by applying a monomer. In an embodiment, since the monomer has flowability, an inkjet process may be used when applying the monomer, for example. Afterwards, the second inorganic encapsulation layer EN3 is formed or disposed on the organic encapsulation layer EN2. The second inorganic encapsulation layer EN3 is also formed or provided by depositing an inorganic material on the entirety of the display region DA and the non-display region NDA.

In an embodiment of the invention, the first inorganic encapsulation layer EN1 and the second inorganic encapsulation layer EN3 may be deposited without a mask. Thereafter, one portion of each of the first inorganic encapsulation layer EN1 and the second inorganic encapsulation layer EN3 that overlap the pad region PDA may be removed by a post process. In an embodiment of the invention, a mask is not used when the first inorganic encapsulation layer EN1 and the second inorganic encapsulation layer EN3 are formed or provided and therefore costs for a mask material and costs for supporting the mask may be reduced.

One portion of the plurality of inorganic encapsulation layers EN1 and EN3 that overlap the plurality of pads PD is etched by atmospheric plasma (S500). The etching of one portion of the plurality of inorganic encapsulation layers EN1 and EN3 using atmospheric plasma may include preparing a plasma generator that generates atmospheric plasma (S510), determining a frequency of an alternating current ("AC") voltage to be provided to the plasma generator (S520), and etching one portion of the plurality of inorganic encapsulation layers EN1 and EN3 that overlap the plurality of pads PD by applying, to the plasma generator, the AC voltage having the frequency which has been determined.

Figure 10:
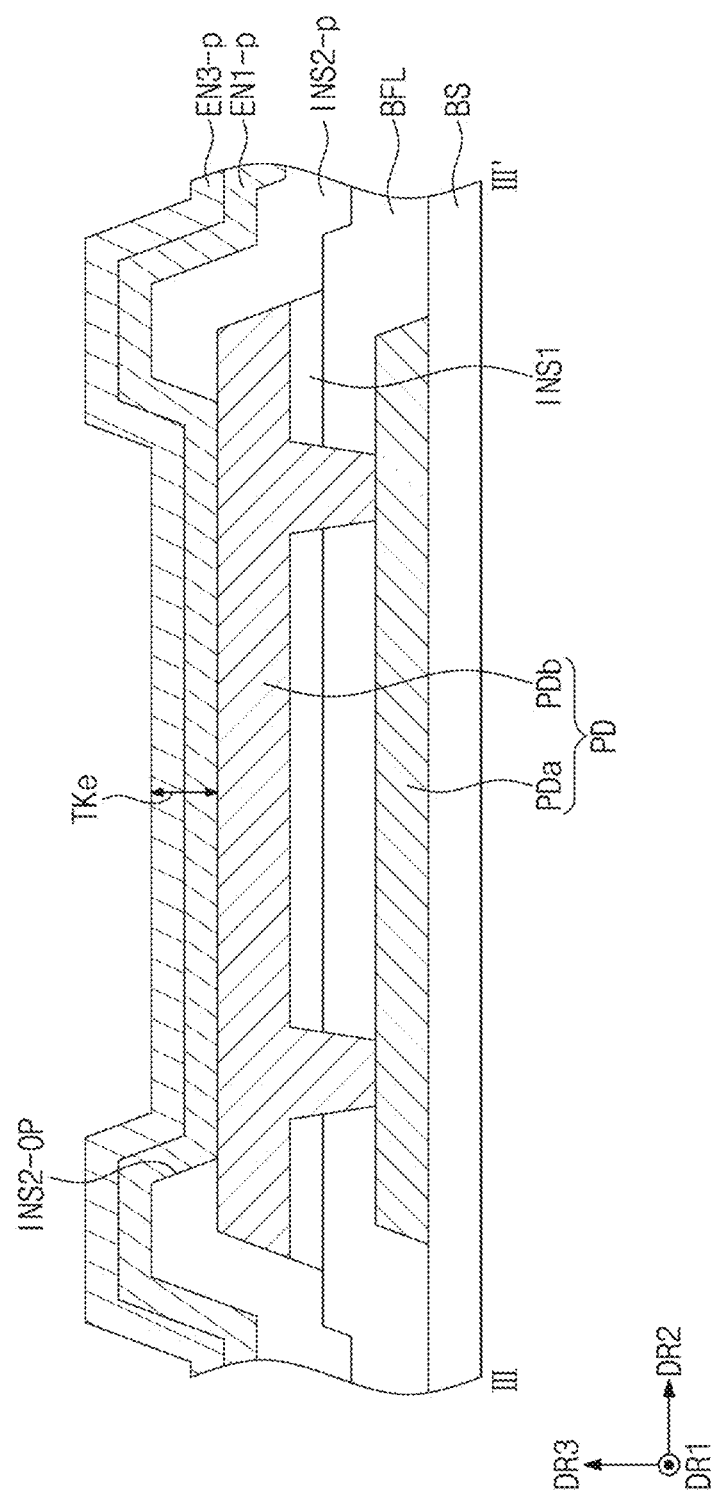
FIG. 10 is a cross-sectional view of an embodiment of a display panel according to the invention.

FIG. 10 is a cross-sectional view of an embodiment of the display panel according to the invention. Specifically, FIG. 10 is a cross-sectional view of a display panel under a manufacturing process.

Referring to FIG. 10, a first preliminary inorganic encapsulation layer EN1-$p$ and a second preliminary inorganic encapsulation layer EN3-$p$ may be disposed on a preliminary protective layer INS2-$p$. The first preliminary inorganic encapsulation layer EN1-$p$ and the second preliminary inorganic encapsulation layer EN3-$p$ may cover an opening INS2-OP in the preliminary protective layer INS2-$p$. That is, the first upper surface portion PDU1 of the pad PD may be covered by the first preliminary inorganic encapsulation layer EN1-$p$ and the second preliminary inorganic encapsulation layer EN3-$p$.

Figure 11:
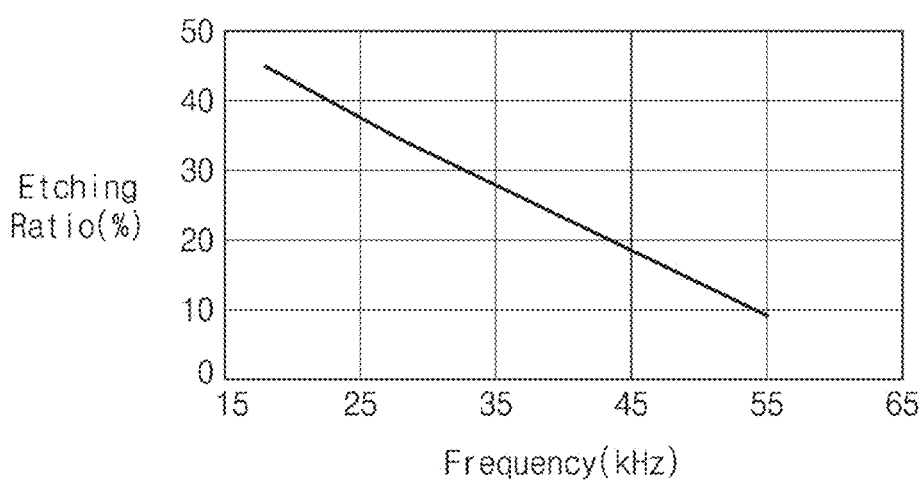
FIG. 11 is a graph showing an etching ratio versus a frequency.

FIG. 11 is a graph showing an etching ratio versus a frequency.

The determining of the frequency of an AC voltage to be provided to the plasma generator is described with reference to FIGS. 7B, 10, and 11.

The first and second preliminary inorganic encapsulation layers EN1-$p$ and EN3-$p$ and the preliminary protective layer INS2-$p$ may each include an inorganic material. In an embodiment, the first and second preliminary inorganic encapsulation layers EN1-$p$ and EN3-$p$ and the preliminary protective layer INS2-$p$ may each include silicon oxide, silicon nitride, or silicon oxynitride, for example. However, an embodiment of the invention is not particularly limited thereto. Therefore, one portion of the preliminary protective layer INS2-$p$ may be etched during a process of removing one portion of the first and second preliminary inorganic encapsulation layers EN1-$p$ and EN3-$p$.

An etching ratio is measured while changing the frequency of the AC voltage to be provided to the plasma generator. In an embodiment, when both of the first and second preliminary inorganic encapsulation layers EN1-$p$ and EN3-$p$ that contact one portion of the first upper surface portion PDU1 of the first surface PDU of each of the plurality of pads PD are removed, a ratio of the second thickness TKp2 of the second portion PP2 of the protective layer INS2 to the first thickness TKp1 of the first portion PP1 of the protective layer INS2 is measured according to the frequency of the AC voltage provided to the plasma generator, for example. That is, when the first and second preliminary inorganic encapsulation layers EN1-$p$ and EN3-$p$ has a thickness TKe of about 0, a ratio of the second thickness TKp2 to the first thickness TKp1 is measured. An etching ratio shown in FIG. 11 may be derived by dividing the second thickness TKp2 by the first thickness TKp1 and then multiplying the resultant value by about 100.

The frequency may be determined on the basis of a ratio of the second thickness TKp2 to the first thickness TKp1, and one portion of each of the first and second preliminary inorganic encapsulation layers EN1-$p$ and EN3-$p$ that overlap the pads PD may be etched by applying, to the plasma generator, the AC voltage having the frequency which has been determined. In addition, a frequency at which the second thickness TKp2 satisfies a predetermined thickness or more may be determined as the frequency of the AC voltage. In an embodiment, the predetermined thickness may be about 2000 angstroms or more and about 20000 angstroms or less.

The numbers of ions and radicals generated by the dissociation of gas molecules per hour according to the frequency may vary. In an embodiment, as the frequency increases, the numbers of ions and radicals may increase, for example. When one portion of the first and second preliminary inorganic encapsulation layers EN1-$p$ and EN3-$p$ is etched, a portion of the preliminary protective layer INS2-$p$ may be etched together. When the preliminary protective layer INS2-$p$ is excessively etched, a side surface of the second pad pattern PDb is exposed, so that the ITO layer and the Cu layer constituting the second pad pattern PDb are delaminated or the Cu layer is oxidized by infiltration of moisture, thereby causing reliability failure.

In an embodiment of the invention, the frequency of the AC voltage to be applied to the plasma generator may be determined on the basis of the ratio of the second thickness TKp2 to the first thickness TKp1 and the second thickness TKp2, and the first and second preliminary inorganic encapsulation layers EN1-$p$ and EN3-$p$ may be etched by the AC voltage having the frequency which has been determined. Therefore, when one portion of the first and second preliminary inorganic encapsulation layers EN1-$p$ and EN3-P is etched until the first upper surface portion PDU1 is exposed, the second surfaces PDS1, PDS2, PDS3, and PDS4 of the second pad pattern PDb and the second upper surface portion PDU2 may be sufficiently covered by the protective layer INS2. As a result, reliability in storage of a product may be improved.

In addition, when the frequency of the AC voltage is less than about 18 kilohertz (kHz), plasma discharge may become unstable. Therefore, the frequency of the AC voltage may be selected within a range of about 18 kHz or more.

Figure 12A:
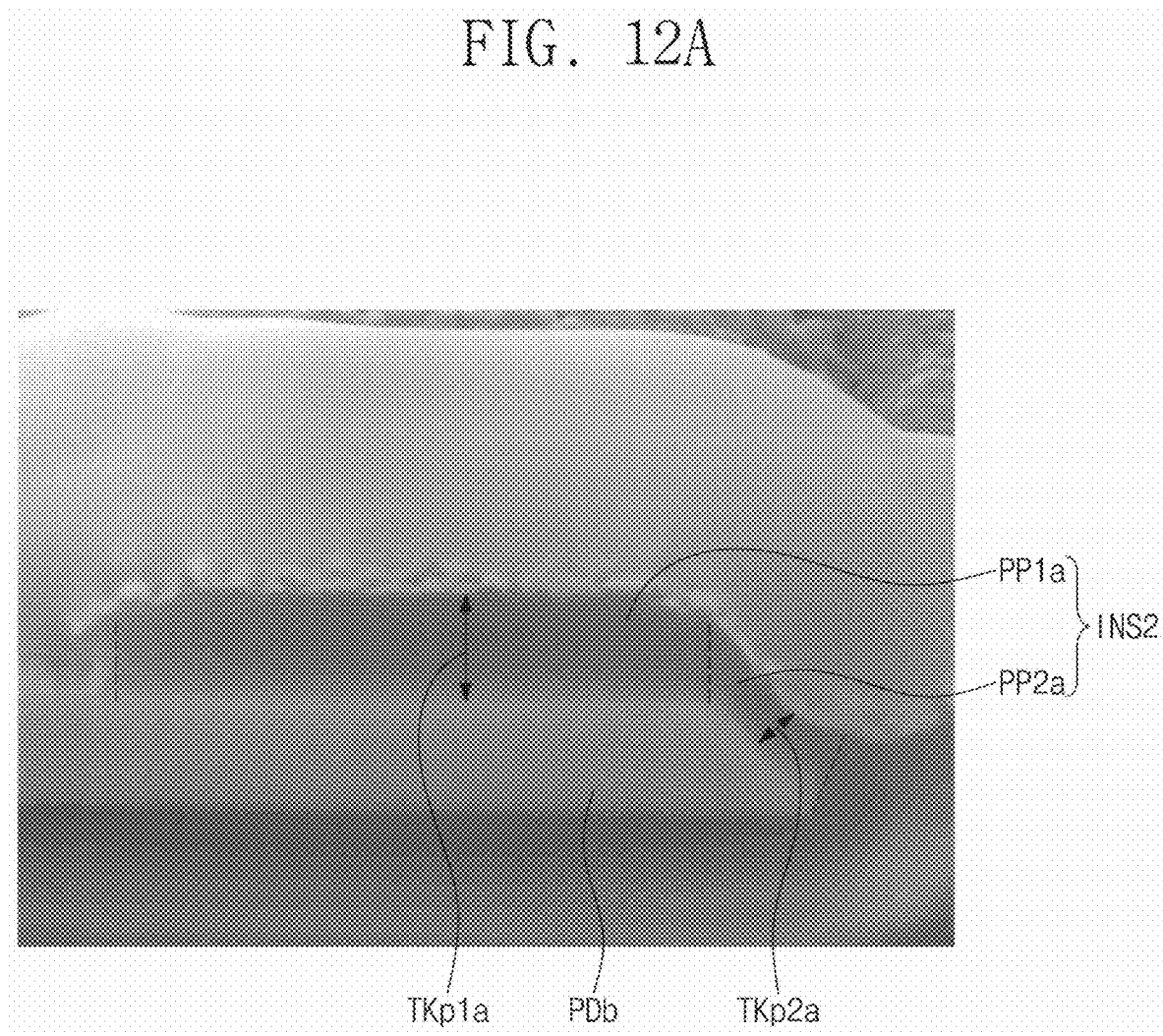
FIG. 12A is a photographed image showing cross sections of a pad and a protective layer.
Figure 12B:
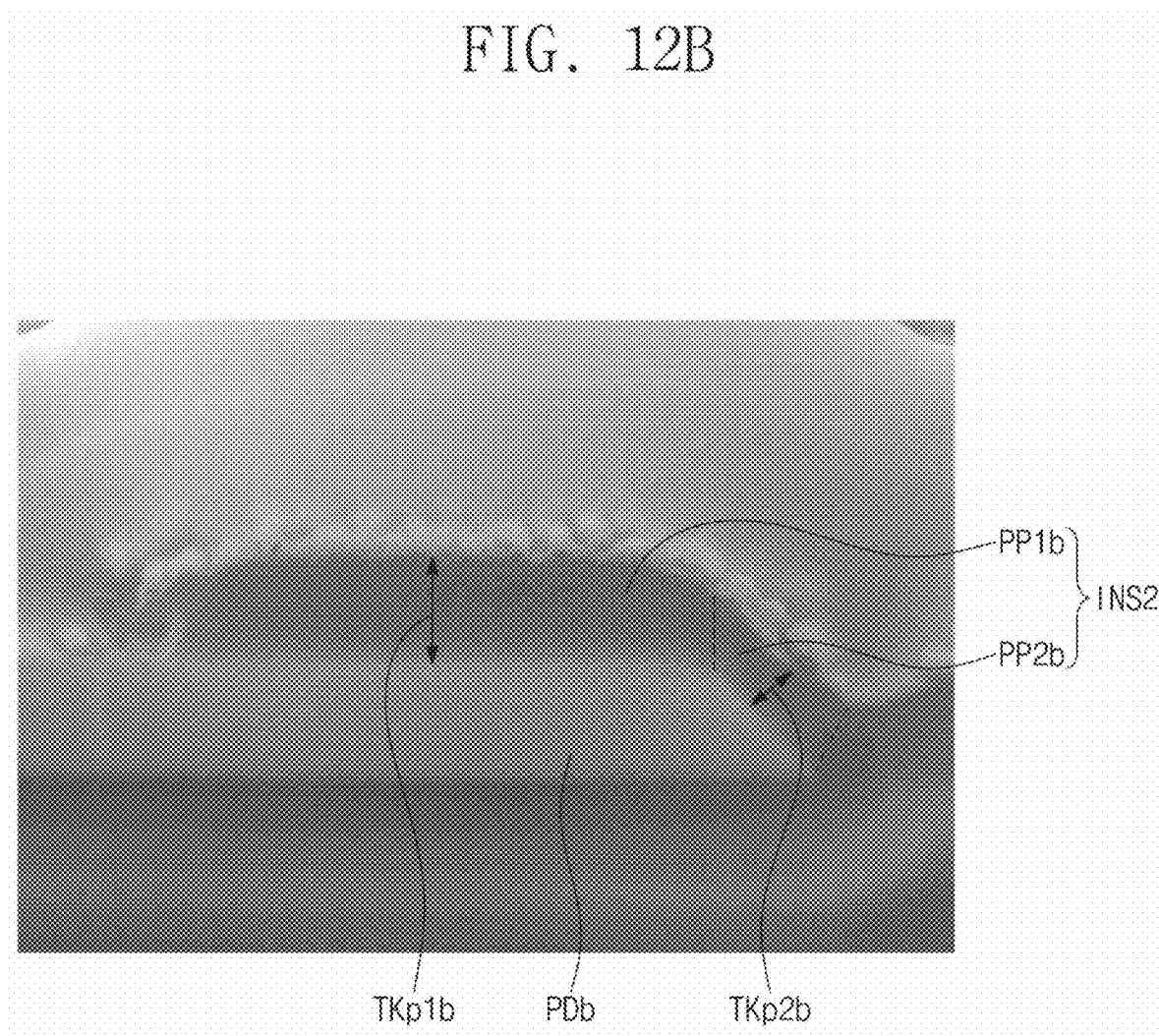
FIG. 12B is a photographed image showing cross sections of a pad and a protective layer.

FIG. 12A is a photographed image showing cross sections of the pad and the protective layer, and FIG. 12B is a photographed image showing cross sections of the pad and the protective layer.

Referring to FIG. 12A, after the first and second preliminary inorganic encapsulation layers EN1-$p$ and EN3-$p$ are etched by the AC voltage of about 28 kHz, the second pad pattern PDb and the protective layer INS2 are photographed. In an embodiment, a thickness TKp1$a$ of the first portion PP1$a$ of the protective layer INS2 may be about 5930 angstroms, and a thickness TKp2$a$ of the second portion PP2$a$ may be about 2030 angstroms.

Referring to FIG. 12B, after the first and second preliminary inorganic encapsulation layers EN1-*p* and EN3-*p* are etched by the AC voltage of about 18 kHz, the second pad pattern PDb and the protective layer INS2 are photographed. In an embodiment, the thickness TKp1*b* of the first portion PP1*b* of the protective layer INS2 may be about 5930 angstroms, and the thickness TKp2*b* of the second portion PP2*b* may be about 2650 angstroms.

Figure 13:
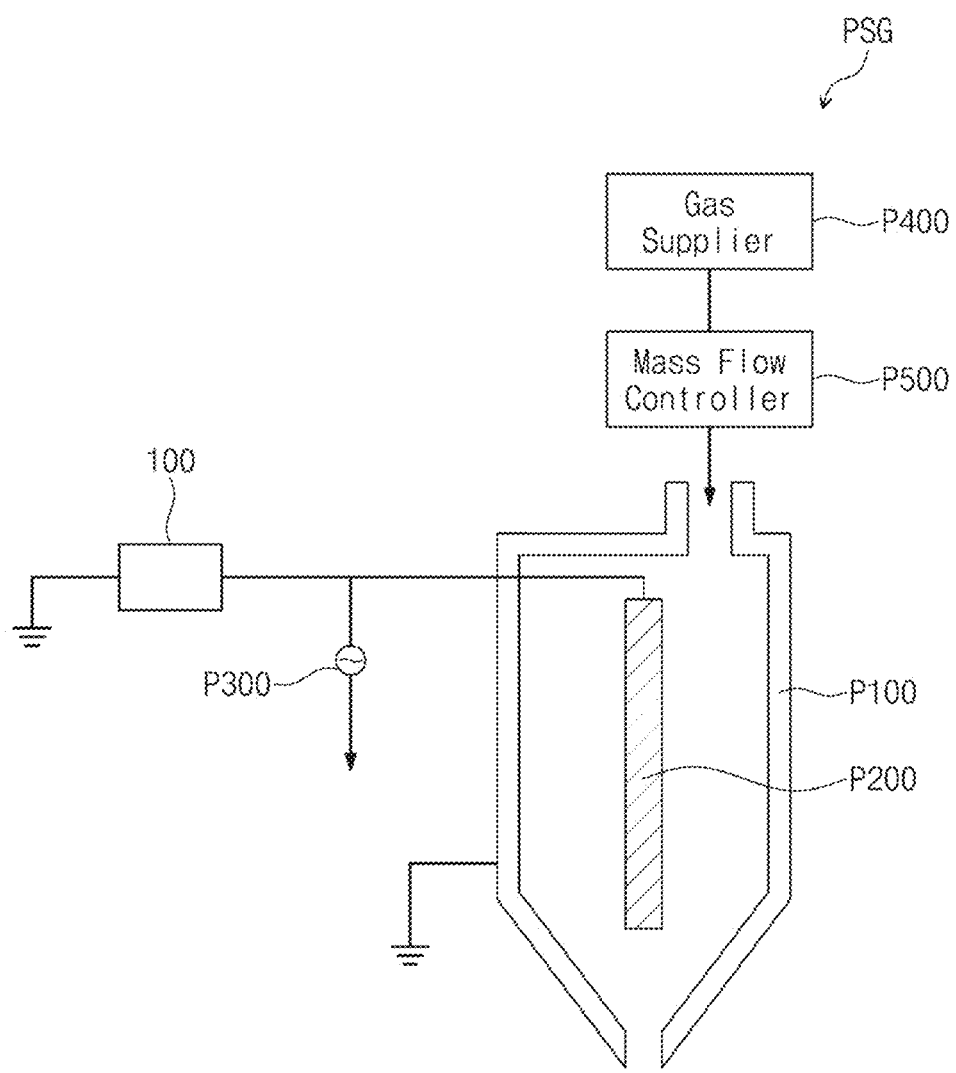
FIG. 13 is a block diagram of an embodiment of a plasma generator according to the invention.

FIG. 13 is a block diagram of an embodiment of a plasma generator according to the invention.

Referring to FIG. 13, the plasma generator PSG may include a tube P100, an electrode P200, a voltage generator P300, a distributor 100, a gas supplier P400, and a mass flow controller P500.

The tube P100 receives gas from the gas supplier P400 and generates plasma therein. The tube P100 may include an inlet port through which gas is introduced and a spray port for discharging plasma. The tube P100 may be grounded. The electrode P200 may be disposed in the tube P100. The electrode P200 may receive an AC voltage. The voltage generator P300 may be connected to the electrode P200 to provide electric power. The distributor 100 may be connected between the electrode P200 and the voltage generator P300, and include a plurality of capacitors connected in series. The gas supplier P400 may supply gas towards the mass flow controller P500.

The block diagram of the plasma generator PSG illustrated in FIG. 13 is merely one of embodiments, and the plasma generator PSG is not limited thereto. As long as capable of generating plasma under atmospheric pressure (also referred to as normal pressure), the generator is not particularly limited.

Figure 14:
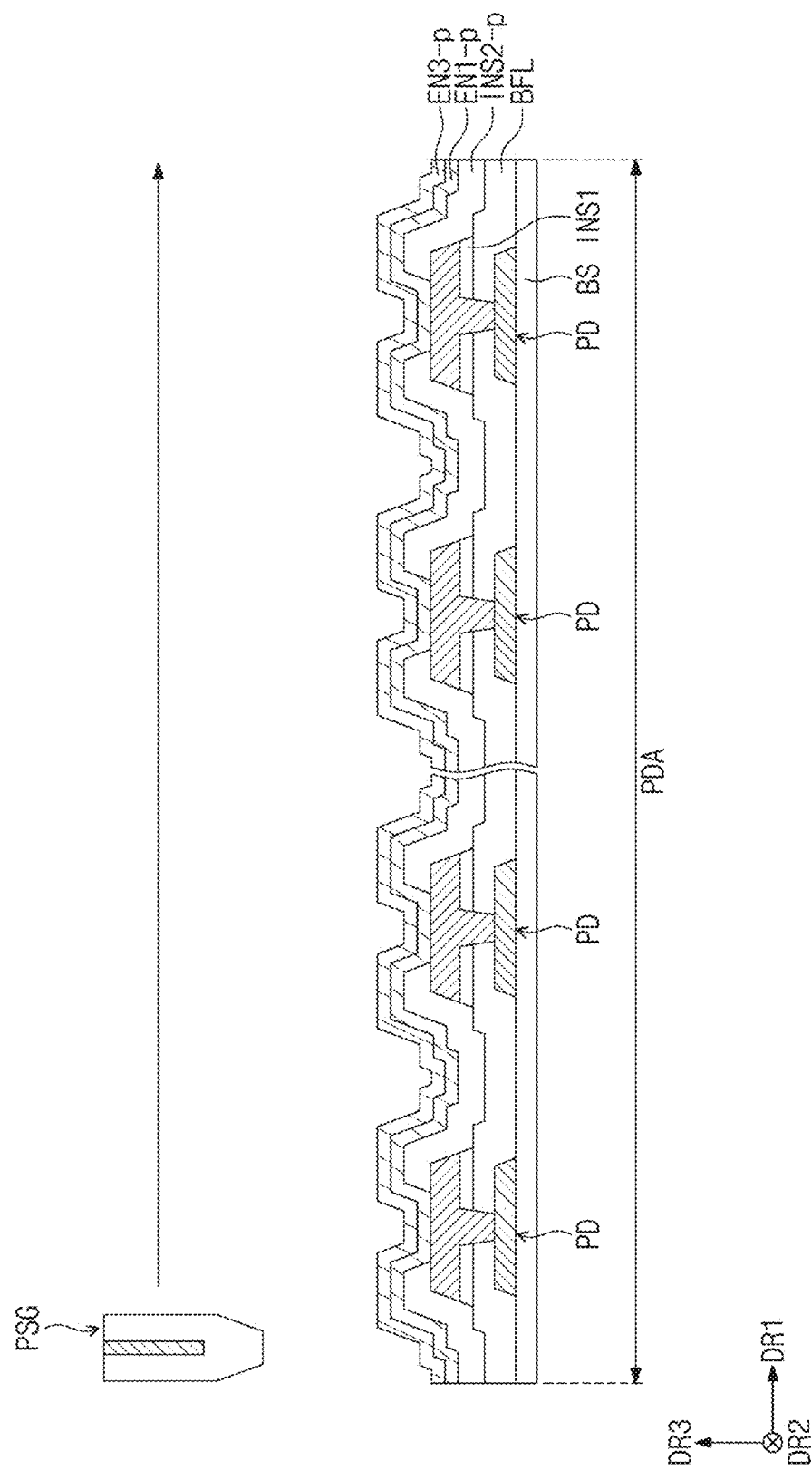
FIG. 14 is a diagram illustrating an embodiment of one of manufacturing processes of a manufacturing method of a display device according to the invention.

FIG. 14 is a diagram illustrating an embodiment of one of manufacturing processes of the manufacturing method of a display device according to the invention.

Referring to FIG. 14, a process of removing one portion of the first and second preliminary inorganic encapsulation layers EN1-*p* and EN3-*p* that overlap the pad region PDA using the plasma generator PSG is illustrated.

The pads PD are spaced in the first direction DR1. The plasma generator PSG may perform atmospheric plasma scanning in the first direction DR1 to etch one portion of the first and second preliminary inorganic encapsulation layers EN1-*p* and EN3-*p*.

The plasma generator PSG may perform scanning once to etch one portion of the first and second preliminary inorganic encapsulation layers EN1-*p* and EN3-*p* that are disposed in the pad region PDA. However, the invention is not limited thereto. In an embodiment, the plasma generator PSG may perform scanning multiple times to etch the one portion of the first and second preliminary inorganic encapsulation layers EN1-*p* and EN3-*p*, for example.

Figure 15:
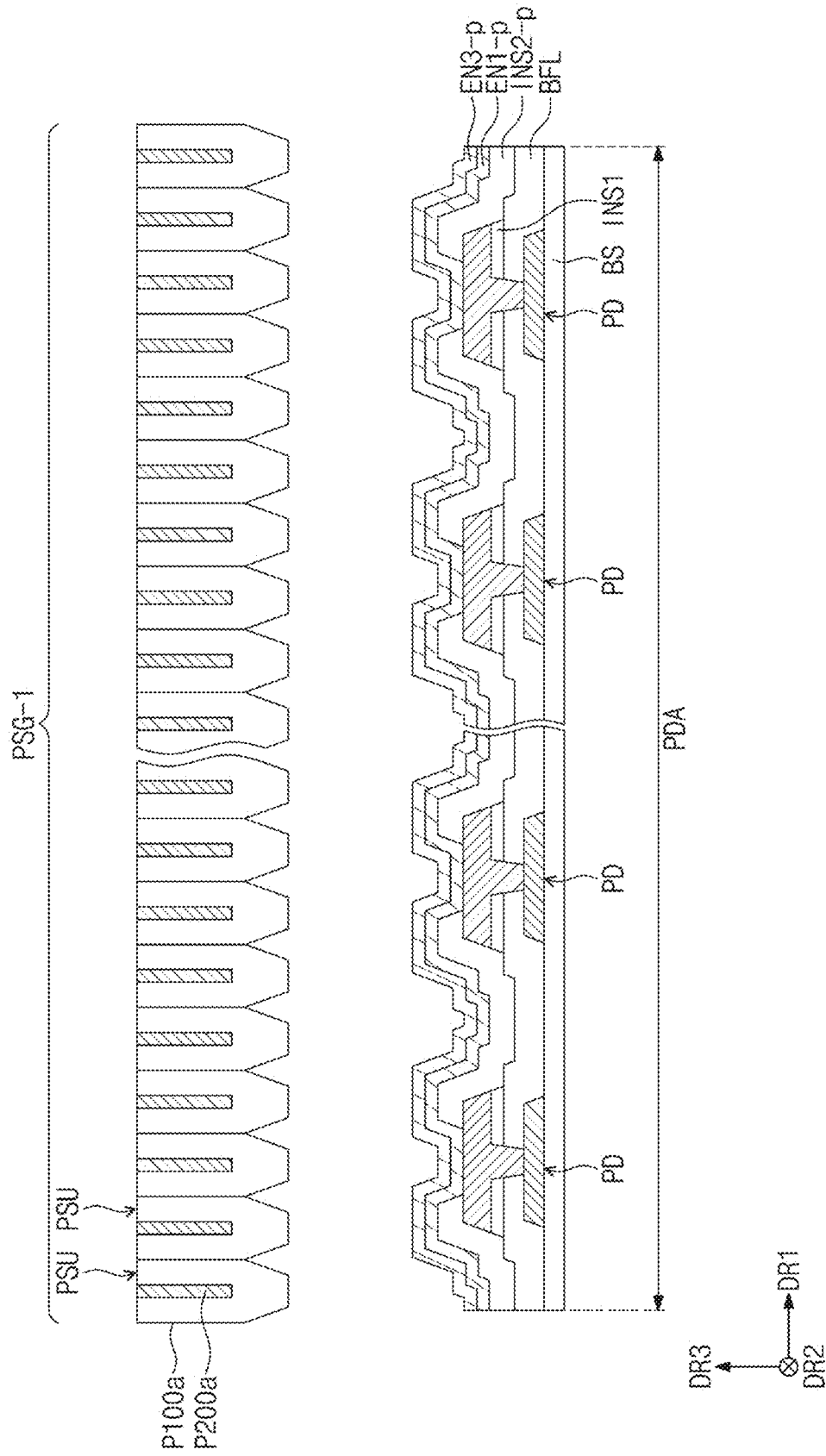
FIG. 15 is a diagram illustrating an embodiment of one of manufacturing processes of a manufacturing method of a display device according to the invention.

FIG. 15 is a diagram illustrating an embodiment of one of the manufacturing processes of the manufacturing method of a display device according to the invention.

Referring to FIG. 15, the plasma generator PSG-1 is aligned to overlap the pads PD. The plasma generator PSG-1 may include a plurality of plasma generating units PSU arranged in the first direction DR1. The plurality of plasma generating units PSU may each include a grounded tube P100*a*, and an electrode P200*a* which is disposed in the tube P100*a* and to which the AC voltage is applied. Afterwards, the plasma generator PSG-1 may etch the one portion of the first and second preliminary inorganic encapsulation layers EN1-*p* and EN3-*p* by supplying atmospheric plasma to the pads PD.

In an embodiment illustrated in FIG. 15, the one portion of the first and second preliminary inorganic encapsulation layers EN1-*p* and EN3-*p* disposed in the pad region PDA may be etched without a separate scanning process.

Figure 16:
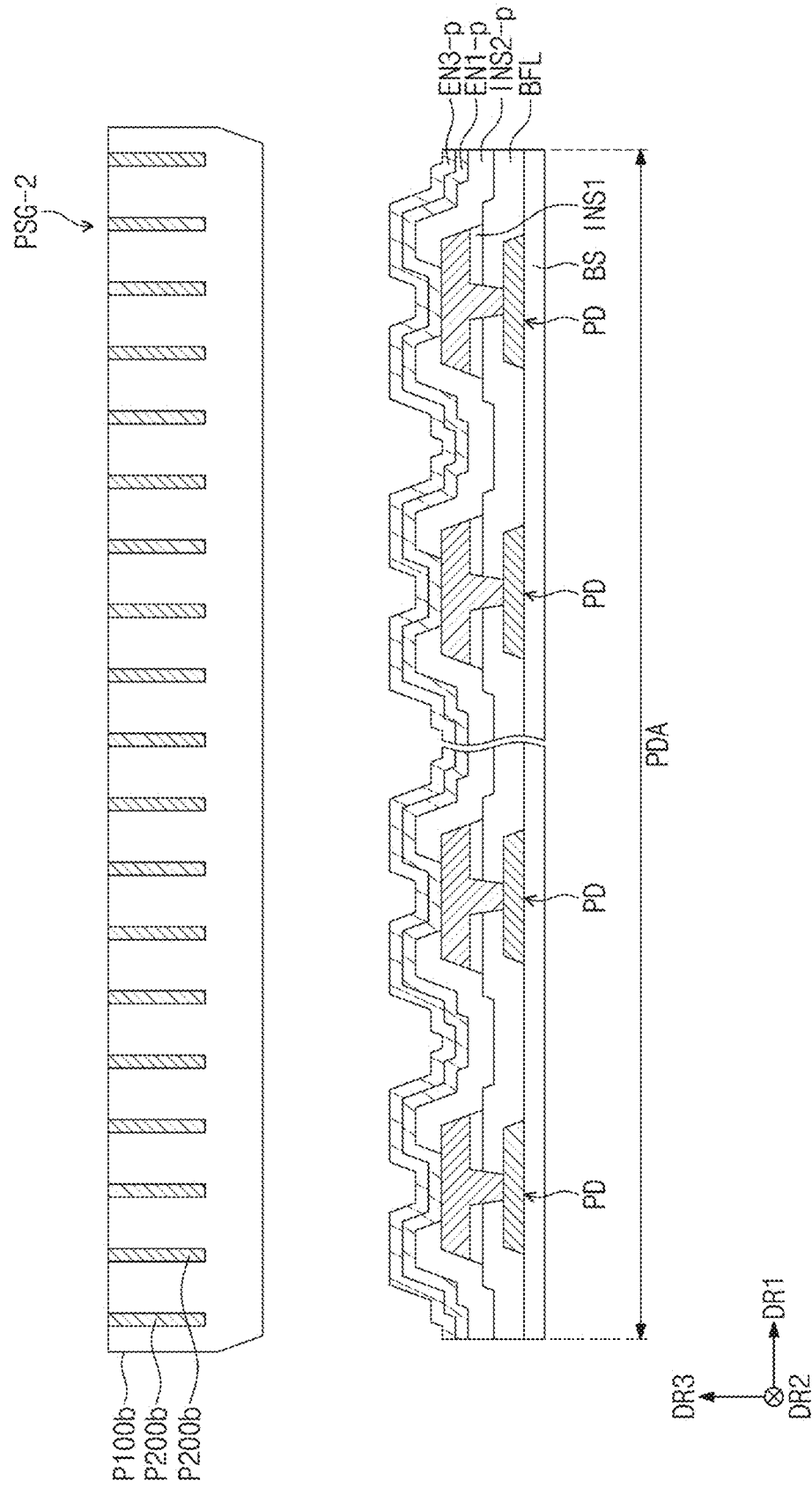
FIG. 16 is a diagram illustrating an embodiment of one of manufacturing processes of a manufacturing method of a display device according to the invention.

FIG. 16 is a diagram illustrating an embodiment of one of the manufacturing processes of the manufacturing method of a display device according to the invention.

Referring to FIG. 16, the plasma generator PSG-2 is aligned to overlap the pads PD. The plasma generator PSG-2 may include a tube P100*b* extending in the first direction DR1 and a plurality of pin electrodes P200*b* arranged in the first direction DR1.

In an embodiment illustrated in FIG. 16, the one portion of the first and second preliminary inorganic encapsulation layers EN1-*p* and EN3-*p* disposed in the pad region PDA may be etched without a separate scanning process.

Figure 17:
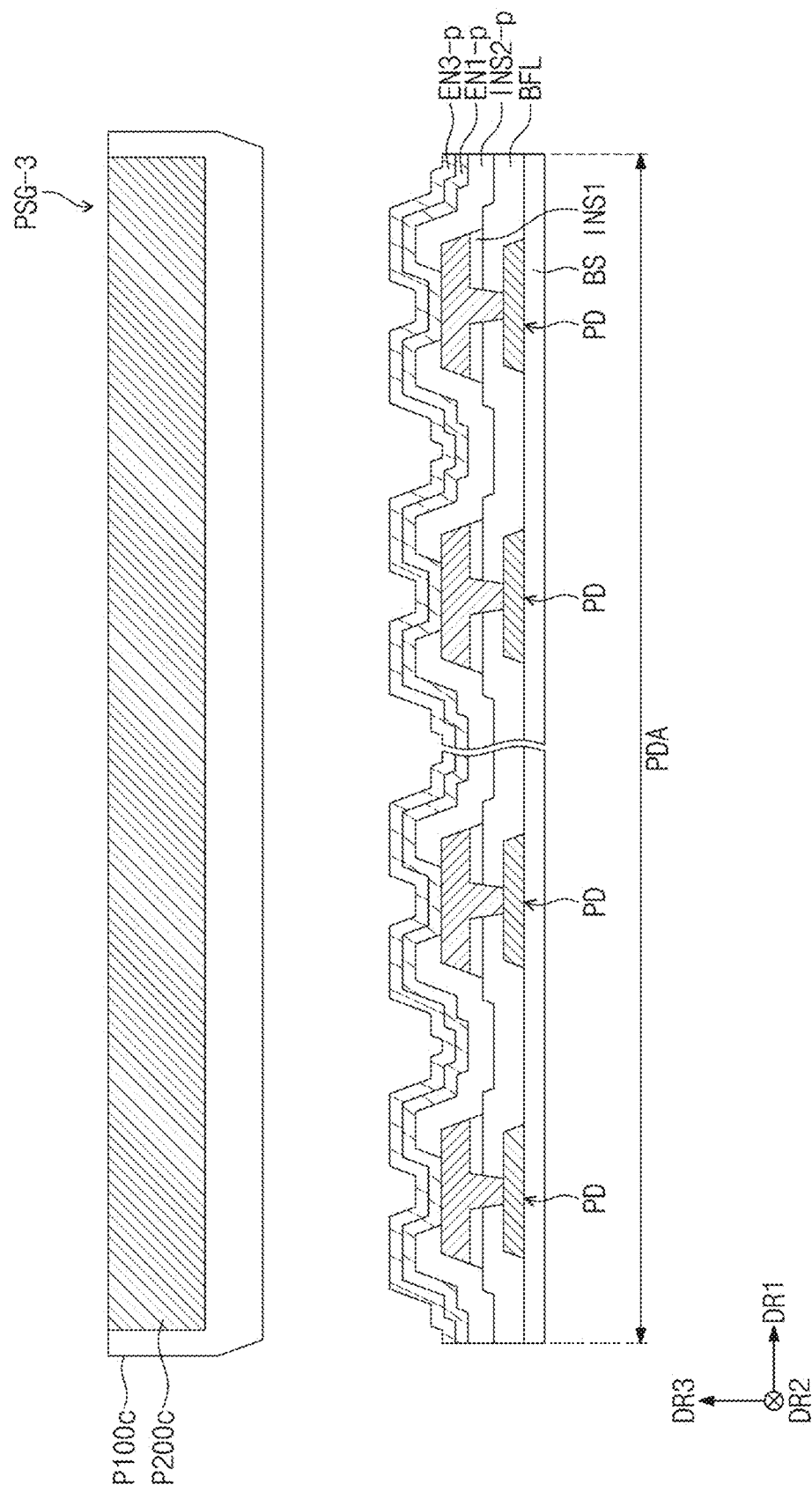
FIG. 17 is a diagram illustrating an embodiment of one of manufacturing processes of a manufacturing method of a display device according to the invention.

FIG. 17 is a diagram illustrating an embodiment of one of the manufacturing processes of the manufacturing method of a display device according to the invention.

Referring to FIG. 17, the plasma generator PSG-3 is aligned to overlap the pads PD. The plasma generator PSG-3 may include a tube P100*c* extending in the first direction DR1 and at least one electrode P200*c* extending in the first direction DR1.

In an embodiment illustrated in FIG. 17, the one portion of the first and second preliminary inorganic encapsulation layers EN1-*p* and EN3-*p* disposed in the pad region PDA may be etched without a separate scanning process.

As described above, inorganic encapsulation layers of an encapsulation layer are deposited without a mask, and then one portion of the inorganic encapsulation layers overlapping a pad region may be removed through a plasma etching process. Since a mask is not used, costs for a mask material and costs for supporting a mask may be reduced. In addition, a frequency of an AC voltage to be provided to a plasma generator may be determined on the basis of a ratio of a second thickness of a second portion of a protective layer that covers a side surface of a pad to a first thickness of a first portion of a protective layer that covers one portion of an upper surface of the pad, and the second thickness, and the inorganic encapsulation layers may be etched by a plasma generator to which the AC voltage with the determined frequency is provided. Accordingly, even after the one portion of the inorganic encapsulation layers is removed by a plasma etching process, the side surface of the pad may be sufficiently covered by the protective layer. Therefore, reliability in storage of a product may be improved.

In the foregoing description, although the embodiments of the invention have been described with reference to a preferred embodiment of the invention, it would be understood that various changes and modifications may be made to the invention by one ordinary skilled in the art within the spirit and scope of the invention as hereinafter claimed. Accordingly, the technical scope of the invention should not be limited to the content described in the detailed description of the specification, but should be defined by the claims.

What is claimed is:

1. An electronic device comprising:
    a display panel in which a display region and a pad region are defined, the display panel including:
        a base substrate;
        a pixel disposed on the base substrate and disposed in the display region;
        a pad disposed on the base substrate, disposed in the pad region, and including a first surface and a plurality of second surfaces connected to the first surface;

a protective layer which covers and contacts the pad and in which an opening which exposes a first upper surface portion of the first surface is defined; and an encapsulation layer which covers the pixel, wherein a first thickness of a first portion of the protective layer which covers a second upper surface portion of the first surface of the pad extending along and parallel to the first upper surface portion of the first surface of the pad is greater than a second thickness of a second portion of the protective layer which covers the plurality of second surfaces of the pad, the first thickness is measured in a direction parallel to a direction perpendicular to the first surface, and the second thickness is measured in a direction parallel to a direction perpendicular to a second surface, contacting the second portion, among the plurality of second surfaces.

2. The electronic device of claim 1, wherein the first thickness of the first portion of the protective layer is about twice or more the second thickness of the second portion of the protective layer.

3. The electronic device of claim 1, wherein the second thickness of the second portion of the protective layer is about 2000 angstroms or more.

4. The electronic device of claim 1, wherein the encapsulation layer comprises an inorganic encapsulation layer and an organic encapsulation layer.

5. The electronic device of claim 4, wherein in a plan view, the inorganic encapsulation layer and the organic encapsulation layer are disposed in an entirety of the display region.

6. The electronic device of claim 4, wherein in a plan view, the inorganic encapsulation layer and the organic encapsulation layer do not overlap the pad region.

7. The electronic device of claim 6, wherein an edge region spaced apart from the display region with the pad region disposed therebetween is further defined in the display panel, and the inorganic encapsulation layer is disposed in the display region and the edge region.

8. The electronic device of claim 1, wherein the protective layer includes an inorganic material.

9. The electronic device of claim 1, further comprising a light control layer which is disposed on the display panel, and includes an optical pattern which converts a color of source light provided from the display panel or scatters the source light.

* * * * *